(12) United States Patent
Nakamura et al.

(10) Patent No.: US 12,103,999 B2
(45) Date of Patent: Oct. 1, 2024

(54) PHOTOSENSITIVE RESIN COMPOSITION, PHOTOSENSITIVE RESIN FILM, PRINTED WIRING BOARD, SEMICONDUCTOR PACKAGE, AND METHOD FOR PRODUCING PRINTED WIRING BOARD

(71) Applicant: Showa Denko Materials Co., Ltd., Tokyo (JP)

(72) Inventors: Akihiro Nakamura, Tokyo (JP); Yuji Takase, Tokyo (JP); Hayato Sawamoto, Tokyo (JP); Yoshikazu Suzuki, Tokyo (JP); Shuji Nomoto, Tokyo (JP); Shota Okade, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 374 days.

(21) Appl. No.: 17/440,499

(22) PCT Filed: May 25, 2020

(86) PCT No.: PCT/JP2020/020614
§ 371 (c)(1),
(2) Date: Sep. 17, 2021

(87) PCT Pub. No.: WO2020/241595
PCT Pub. Date: Dec. 3, 2020

(65) Prior Publication Data
US 2022/0169772 A1  Jun. 2, 2022

(30) Foreign Application Priority Data
May 31, 2019 (JP) ................................ 2019-102945

(51) Int. Cl.
*C08F 290/14* (2006.01)
*G03F 7/031* (2006.01)
(Continued)

(52) U.S. Cl.
CPC .......... *C08F 290/144* (2013.01); *G03F 7/031* (2013.01); *H01L 23/145* (2013.01);
(Continued)

(58) Field of Classification Search
CPC .... C08F 290/144; G03F 7/031; H01L 23/145; H05K 1/032; H05K 1/0373; H05K 3/4676
See application file for complete search history.

(56) References Cited

U.S. PATENT DOCUMENTS 5,387,493 A * 2/1995 Imabayashi ............. G03F 7/028
                                                430/286.1
2003/0087189 A1 * 5/2003 Takagi ............. H01L 23/49894
                                                430/311
(Continued)

FOREIGN PATENT DOCUMENTS

EP         2168994 A1    3/2010
JP        H07-304931 A  11/1995
(Continued)

*Primary Examiner* — Nathan Milakovich
(74) *Attorney, Agent, or Firm* — FITCH, EVEN, TABIN & FLANNERY, LLP

(57) ABSTRACT

The present invention relates to provision of a photosensitive resin composition containing (A) a photopolymerizable compound having an ethylenically unsaturated group and an acidic substituent, and (B) a photopolymerization initiator, wherein at least one of the components contained in the photosensitive resin composition is a component including a dicyclopentadiene structure; a photosensitive resin film using the foregoing photosensitive resin composition; a printed wiring board and a method for producing the same; and a semiconductor package.

19 Claims, 1 Drawing Sheet

(51) Int. Cl.
  *H01L 23/14* (2006.01)
  *H05K 1/03* (2006.01)
  *H05K 3/46* (2006.01)
(52) U.S. Cl.
  CPC ........... *H05K 1/032* (2013.01); *H05K 3/4676* (2013.01); *H05K 1/0373* (2013.01)

(56) References Cited

U.S. PATENT DOCUMENTS

| | | | |
|---|---|---|---|
| 2022/0155681 A1* | 5/2022 | Sawamoto | H01L 23/49894 |
| 2022/0179308 A1* | 6/2022 | Okade | C08F 212/08 |
| 2022/0276558 A1* | 9/2022 | Abe | G03F 7/028 |
| 2023/0047699 A1* | 2/2023 | Sawamoto | H05K 3/389 |
| 2023/0303750 A1* | 9/2023 | Otsuka | C08F 2/50 |

FOREIGN PATENT DOCUMENTS

| | | | |
|---|---|---|---|
| JP | H10282666 A * | 10/1998 | |
| JP | 2000-321765 A | 11/2000 | |
| JP | 2012-503690 A | 2/2012 | |
| JP | 2017-116652 A | 6/2017 | |
| JP | 2017-215565 A | 12/2017 | |
| JP | 6338232 B1 | 6/2018 | |
| JP | 6387543 B1 | 9/2018 | |
| JP | 2018138968 A * | 9/2018 | |
| JP | 2018-163207 A | 10/2018 | |
| JP | 2018-169608 A | 11/2018 | |
| WO | 2007/093284 A1 | 8/2007 | |
| WO | 2014/017115 A1 | 1/2014 | |

\* cited by examiner

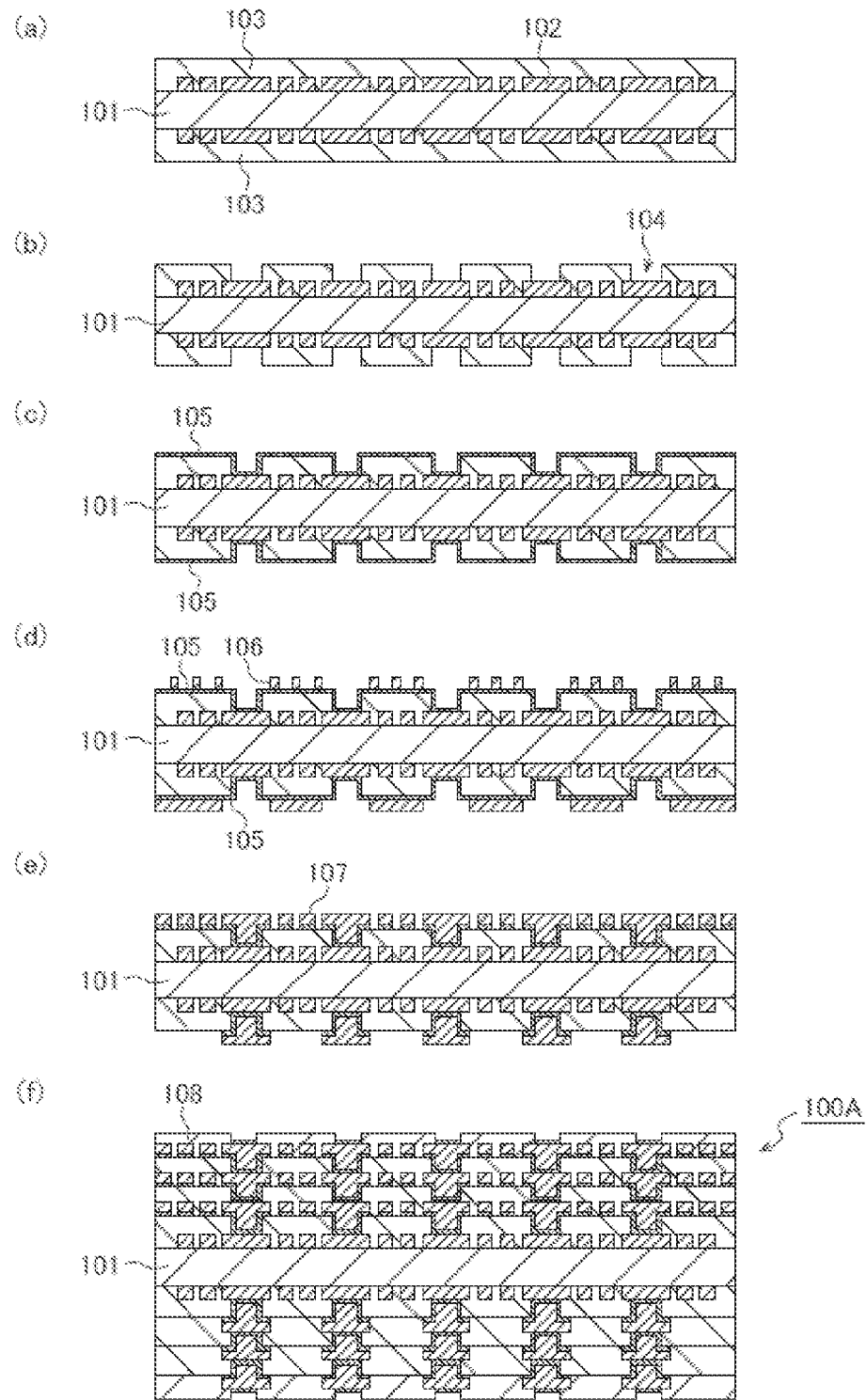

PHOTOSENSITIVE RESIN COMPOSITION, PHOTOSENSITIVE RESIN FILM, PRINTED WIRING BOARD, SEMICONDUCTOR PACKAGE, AND METHOD FOR PRODUCING PRINTED WIRING BOARD

CROSS-REFERENCE TO RELATED APPLICATIONS

This application is a U.S. national phase application filed under 35 U.S.C. § 371 of International Application No. PCT/JP2020/020614, filed May 25, 2020, designating the United States, which claims priority from Japanese Application No. 2019-102945, filed May 31, 2019, which is hereby incorporated herein by reference in its entirety.

TECHNICAL FIELD

The present disclosure relates to a photosensitive resin composition, a photosensitive resin film, a printed wiring board, a semiconductor package, and a method for producing a printed wiring board.

BACKGROUND ART

In recent years, following the high performance (miniaturization, weight reduction, and multi-functionalization) of electronic devices, semiconductor components, such as LSI (Large Scale Integration) and chips, have been highly integrated. Following that, the form of semiconductor parts is rapidly changing to multi-pin and miniaturization. In addition, with the increasing integration of semiconductor parts, the density and definition of semiconductor elements, semiconductor packages, printed wiring boards, flexible wiring boards, etc. that make up semiconductor parts are increasing, and part-built-in substrates in which chips, chip capacitors, etc. are embedded inside the substrates are being studied. As the surface protective film or interlayer insulating layer used for semiconductor parts, it is required that a via opening pattern for interlayer connection can be formed, and that it can be adhered not only to a substrate material and a copper pattern (conductor pattern) but also to a chip component.

A build-up method is exemplified as a method for producing a printed wiring board that has been conventionally adopted. In this build-up method, first, the surface of the inner layer circuit board (the base material having the first conductor pattern) is chemically or physically surface-treated to form a roughened shape. Subsequently, an insulating resin film is laminated on the roughened inner layer circuit board, the insulating resin film is cured by heating to form an interlayer insulating layer, and then, via holes are formed by laser processing. Continuously, the interlayer insulating layer is roughened and smeared with an alkaline permanganate or the like, and then, electroless copper plating is performed to form a second conductor pattern and via holes that enable interlayer connection (see, for example, PTL 1).

As mentioned above, laser processing is the mainstream as a method for forming vias in the interlayer insulating layer, but the reduction in diameter of vias by laser irradiation using a laser processing machine is reaching its limit. Furthermore, in the formation of vias by a laser processing machine, it is necessary to form each via hole one by one, and in the case where a large number of vias are provided by increasing the density, there is involved such a problem that it takes a long time to form the vias, and the production efficiency is poor.

By the way, in recent years, with the increase in the density of conductor patterns, high resolution is required for the surface protective film, and photosensitive resin compositions capable of forming patterns by a photolithography method have been widely used. Above all, alkali-developing type photosensitive resin compositions that can be developed with a weak alkaline aqueous solution, such as a sodium carbonate aqueous solution, have become the mainstream from the standpoint of work environment conservation and global environment conservation. A method of applying pattern formation by a photolithography method to the formation of via holes has been studied. For example, as a method capable of collectively forming a large number of vias by the photolithography method, PTL 2 proposes a method of using a photosensitive resin composition containing an acid-modified vinyl group-containing epoxy resin, a photopolymerizable compound, a photopolymerization initiator, an inorganic filler, and a silane compound, in which the content of the inorganic filler is 10 to 80% by mass.

With the miniaturization of a second conductor pattern and the reduction in the diameter of the via hole, it is necessary to reduce the surface roughness on the inner layer circuit board (the base material having a first conductor pattern). On the other hand, in the conventional surface treatment, it is necessary to increase the etching depth in order to enhance the adhesiveness to the resin (for example, in the working examples of PTL 3, the copper surface is etched by 1 μm or more), so that when applied to the wiring layer of the printed wiring board, the line thinning becomes remarkable, and there is a limit to the correspondence to the miniaturization (narrowing of pitch) of the wiring. In addition, if the surface roughness of the conductor becomes large due to the large etching depth, there is a problem that it becomes difficult to provide an opening of a small diameter when a via hole is formed by a photolithography method using a photosensitive resin composition. On the other hand, if the chemical or physical treatment is not performed, the surface roughness of the conductor becomes small, and there is a problem that the adhesion between the inner layer circuit and the resin (insulating layer) cannot be ensured.

As a method for solving the aforementioned problems, there are disclosed an etching agent capable of maintaining adhesion between copper and a resin even in a low etching amount (see, for example, PTL 4); a coating film-forming composition capable of forming on a metal surface a coating film with excellent adhesiveness to a resin within a short period of time (see, for example, PTL 5); a surface roughening method capable of forming on a copper surface a roughened shape with excellent adhesion to a resin, etc. at a low etching amount (see, for example, PTL 6); and so on.

CITATION LIST

Patent Literature

PTL 1: JP 7-304931 A
PTL 2: JP 2017-116652 A
PTL 3: WO 2007/093284 A
PTL 4: WO 2014/017115 A
PTL 5: Japanese Patent No. 6387543
PTL 6: Japanese Patent No. 6338232

SUMMARY OF INVENTION

Technical Problem

However, for the purpose of miniaturizing the conductor pattern and reducing the diameter of the via hole, for example, if the etching amount is reduced from conventional 1 μm to 0.4 μm or less, the adhesion to an inner layer circuit is lowered, whereby a problem that before the high temperature and high humidity test and after the high temperature and high humidity test, the sufficient adhesion strength to an inner layer circuit cannot be obtained is generated.

Then, a problem of the present invention is to provide a photosensitive resin composition that is excellent in adhesion to an inner layer circuit, a photosensitive resin film using the foregoing photosensitive resin composition, a printed wiring board and a method for producing the same, and a semiconductor package.

Solution to Problem

In order to solve the aforementioned problem, the present inventors made extensive and intensive investigations. As a result, it has been found that the aforementioned problem can be solved by the present invention as mentioned below, thereby leading to accomplishment of the present invention.

Specifically, the present invention relates to the following [1] to [18].
[1] A photosensitive resin composition containing
(A) a photopolymerizable compound having an ethylenically unsaturated group and an acidic substituent, and
(B) a photopolymerization initiator, wherein
at least one of the components contained in the photosensitive resin composition is a component including a dicyclopentadiene structure.
[2] The photosensitive resin composition as set forth in the above [1], wherein the component including a dicyclopentadiene structure is one including a structure represented by the following general formula (X-1);

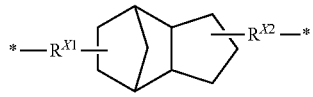

(X-1)

wherein $R^{X1}$ and $R^{X2}$ are each independently a divalent group having at least one group selected from the group consisting of an alkylene group, an arylene group, and an oxy group; and * is a binding site to other structure.
[3] The photosensitive resin composition as set forth in the above [1] or [2], wherein a total mass of the dicyclopentadiene structure contained in the photosensitive resin composition is 5% by mass or more on the basis of the whole amount of the solid components of the components contained in the photosensitive resin composition.
[4] The photosensitive resin composition as set forth in any of the above [1] to [3], wherein the photopolymerizable compound having an ethylenically unsaturated group and an acidic substituent is an acid-modified ethylenically unsaturated group-containing epoxy derivative obtained by allowing (A') a resin that is obtained through a reaction of (a) an epoxy resin and (b) an ethylenically unsaturated group-containing organic acid, to react with (c) a saturated group or unsaturated group-containing polybasic acid anhydride.
[5] The photosensitive resin composition as set forth in any of the above [1] to [4], wherein the photopolymerizable compound (A) having an ethylenically unsaturated group and an acidic substituent is one including a dicyclopentadiene structure.
[6] The photosensitive resin composition as set forth in the above [4], wherein the photopolymerizable compound (A) having an ethylenically unsaturated group and an acidic substituent contains
(A1) an acid-modified ethylenically unsaturated group-containing epoxy derivative that is obtained by using, as the epoxy resin (a), an epoxy resin having a dicyclopentadiene structure, and
(A2) an acid-modified ethylenically unsaturated group-containing epoxy derivative that is obtained by using, as the epoxy resin (a), at least one selected from the group consisting of a novolak type epoxy resin, a bisphenol type epoxy resin, and a triphenolmethane type epoxy resin.
[7] The photosensitive resin composition as set forth in any of the above [1] to [6], further containing (C) a photopolymerizable compound not having an acidic substituent.
[8] The photosensitive resin composition as set forth in the above [7], wherein the photopolymerizable compound (C) not having an acidic substituent is a polyfunctional monomer having three or more ethylenically unsaturated groups.
[9] The photosensitive resin composition as set forth in the above [7] or [8], wherein the photopolymerizable compound (C) not having an acidic substituent is one including a dicyclopentadiene structure.
[10] The photosensitive resin composition as set forth in any of the above [1] to [9], further containing (D) a thermosetting resin.
[11] The photosensitive resin composition as set forth in any of the above [1] to [10], further containing (E) a pigment.
[12] The photosensitive resin composition as set forth in any of the above [1] to [11], further containing (F) an inorganic filler.
[13] A photosensitive resin composition for photo via formation, including the photosensitive resin composition as set forth in any of the above [1] to [12].
[14] A photosensitive resin composition for interlayer insulating layer, including the photosensitive resin composition as set forth in any of the above [1] to [12].
[15] A photosensitive resin film including the photosensitive resin composition as set forth in any of the above [1] to [12].
[16] A printed wiring board containing a surface protective film or an interlayer insulating layer that is formed by using the photosensitive resin composition as set forth in any of the above [1] to [12] or the photosensitive resin film as set forth in the above [15].
[17] A semiconductor package including the printed wiring board as set forth in the above [16] having a semiconductor element mounted thereon.
[18] A method for producing a printed wiring board, including a step of providing a photosensitive layer using the photosensitive resin composition as set forth in any of the above [1] to [12] or the photosensitive resin film as set forth in the above [15] on a substrate; a step of forming a resin pattern by using the photosensitive layer; and a step of curing the resin pattern to form at least one of a surface protective film and an interlayer insulating layer, in this order.

Advantageous Effects of Invention

In accordance with the present invention, it is possible to provide a photosensitive resin composition that is excellent in adhesion to an inner layer circuit, a photosensitive resin film using the foregoing photosensitive resin composition, a printed wiring board and a method for producing the same, and a semiconductor package.

BRIEF DESCRIPTION OF DRAWING

FIG. 1 is a schematic view showing an embodiment of the production process of a multilayer printed wiring board using a cured product of the photosensitive resin composition of the present embodiment as at least one of a surface protective film and an interlayer insulating layer.

DESCRIPTION OF EMBODIMENTS

In numerical value ranges described in this specification, an upper limit value or a lower limit value in a respective numerical value range may be substituted by a value described in the section of Examples. Furthermore, in this specification, as for the content of a respective component in the photosensitive resin composition, in the case where plural kinds of substances corresponding to the respective component exist, it means a total content of the plural kinds of substances existing in the photosensitive resin composition unless otherwise indicated.

Embodiments of any arbitrary combination of the matters described in this specification are also included in the present invention.

In this specification, the "resin component" means the whole amount of the components not including an inorganic filler and a diluent as mentioned later, each of which may be contained, if desired.

In addition, in this specification, the "solid component" means a nonvolatile component contained in the photosensitive resin composition, exclusive of a volatile substance, such as water and a solvent, and refers to a component which during drying the resin composition, remains without being volatilized, and it also includes those which are in a liquid state, a starch syrup-like state, or a waxy state at room temperature in the vicinity of 25° C.

In this specification, the term "(meth)acrylate" means "acrylate or methacrylate", and the same is also applicable to other analogous terms.

[Photosensitive Resin Composition]

The photosensitive resin composition of the present embodiment is a photosensitive resin composition containing (A) a photopolymerizable compound having an ethylenically unsaturated group and an acidic substituent, and (B) a photopolymerization initiator, wherein at least one of the components contained in the photosensitive resin composition is a component including a dicyclopentadiene structure.

In this specification, the aforementioned components are occasionally abbreviated and referred to as "component (A)", "component (B)", and so on, respectively, and other components are occasionally abbreviated in the same way.

Since the photosensitive resin composition of the present embodiment is suitable for via formation by photolithography [hereinafter occasionally referred to as "photo via formation"], the present invention also provides a photosensitive resin composition for photo via formation, which is composed of the photosensitive resin composition of the present embodiment. In addition, since the photosensitive resin composition of the present embodiment is excellent in resolution, adhesion to an inner layer circuit, and electrical insulation reliability and is useful as an interlayer insulating layer of a multilayer printed wiring board, the present invention further provides a photosensitive resin composition for interlayer insulating layer, which is composed of the photosensitive resin composition of the present embodiment. In the case where the photosensitive resin composition is referred to in this specification, a photosensitive resin composition for photo via formation and a photosensitive resin composition for interlayer insulating layer are also included.

The photosensitive resin composition of the present embodiment is useful as a negative working-type photosensitive resin composition.

The respective components which can be contained in the photosensitive resin composition of the present embodiment are hereunder described in detail.

<Component Including Dicyclopentadiene Structure>

In the photosensitive resin composition of the present embodiment, at least one of the components contained in the photosensitive resin composition is a component including a dicyclopentadiene structure.

In view of the fact that the photosensitive resin composition of the present embodiment contains the component having a dicyclopentadiene structure, it is excellent in adhesion to an inner layer circuit.

In the following description, among the components included in the photosensitive resin composition of the present embodiment, the component including a dicyclopentadiene structure is occasionally referred to as "(X) a dicyclopentadiene structure-containing compound" or "component (X)".

The dicyclopentadiene structure in the present embodiment means a structure represented by the following formula (X-2).

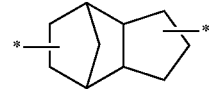

(X-2)

The dicyclopentadiene structure-containing compound (X) is preferably one including a structure represented by the following general formula (X-1).

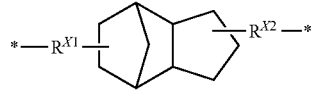

(X-1)

In the formula, $R^{X1}$ and $R^{X2}$ are each independently a divalent group having at least one group selected from the group consisting of an alkylene group, an arylene group, and an oxy group; and * is a binding site to other structure.

Examples of the alkylene group which $R^{X1}$ and $R^{X2}$ may have include a methylene group, a 1,2-dimethylene group, a 1,3-trimethylene group, a 1,4-tetramethylene group, and a 1,5-pentamethylene group. The carbon number of the alkylene group is preferably 1 to 10. The carbon number of the alkylene group does not include the carbon number of the substituent.

The alkylene group may have or may not have a substituent. Examples of the substituent which the alkylene group may have include an aromatic hydrocarbon group; a halogen atom; an alkoxy group, an aryloxy group, a hydroxy group, a carboxy group, an amino group, and a glycidyl ether group; and combined groups thereof. The carbon number of the substituent of the alkylene group is preferably 1 to 20, and more preferably 1 to 12.

Examples of the arylene group which $R^{X1}$ and $R^{X2}$ may have include a phenylene group and a naphthylene group. The carbon number of the arylene group is preferably 6 to 12. The carbon number of the arylene group does not include the carbon number of the substituent.

The arylene group may have or may not have a substituent. Examples of the substituent which the arylene group may have include an aliphatic hydrocarbon group; a halogen atom; an alkoxy group, an aryloxy group, a hydroxy group, a carboxy group, an amino group, and a glycidyl ether group; and combined groups thereof. The carbon number of the substituent of the arylene group is preferably 1 to 20, and more preferably 1 to 12.

From the viewpoint of improving the adhesion to an inner layer circuit, the adhesion strength against sputtering, and the electrical characteristics, a total mass of the dicyclopentadiene structure (namely, the structure represented by the general formula (X-1)) which is contained in the photosensitive resin composition of the present embodiment is preferably 5% by mass or more, more preferably 7% by mass or more, and still more preferably 8% by mass or more on the basis of the whole amount of the solid components of the components contained in the photosensitive resin composition. In addition, the total mass of the dicyclopentadiene structure may be 15% or less or may be 10% by mass or less on the basis of the whole amount of the solid components of the components contained in the photosensitive resin composition.

A proportion at which the molecular weight of the dicyclopentadiene structure in the component (X) occupies can be measured by means of liquid or solid NMR. For example, in the case where the proportion at which the molecular weight of the dicyclopentadiene structure in the component (X) occupies is determined as P (% by mass), the "total mass of the dicyclopentadiene structure contained in the photosensitive resin composition" (defined as Q (parts by mass)) is calculated from P (% by mass) and the whole amount of the solid components of the component (X) blended in the photosensitive resin composition (defined as R (parts by mass)) as follows.

$$Q(\text{parts by mass}) = \{R(\text{parts by mass}) \times P(\% \text{ by mass})\}/100$$

The dicyclopentadiene structure-containing compound (X) may be one to be contained as the component (A) which the photosensitive resin composition of the present embodiment contains or may be one to be contained as other component than the component (A); however, it is preferably contained as the component (A) from the viewpoint of improving the adhesion to an inner layer circuit. That is, the component (A) is preferably one including a dicyclopentadiene structure.

<(A) Photopolymerizable Compound Having Ethylenically Unsaturated Group and Acidic Substituent>

The photosensitive resin composition of the present embodiment contains a photopolymerizable compound having an ethylenically unsaturated group and an acidic substituent as the component (A).

The component (A) may be used alone or may be used in combination of two or more thereof.

In view of the fact that the component (A) has an ethylenically unsaturated group, it is a compound exhibiting photopolymerizability.

Examples of the ethylenically unsaturated group which the component (A) has include functional groups exhibiting photopolymerizability, such as a vinyl group, an allyl group, a propargyl group, a butenyl group, an ethynyl group, a phenylethynyl group, a maleimide group, a nadimide group, and a (meth)acryloyl group. Of these, a (meth)acryloyl group is preferred from the viewpoint of reactivity and resolution.

The component (A) is one having an acidic substituent from the viewpoint of making it possible to achieve alkaline development.

Examples of the acidic substituent which the component (A) has include a carboxy group, a sulfonic acid group, and a phenolic hydroxy group. Of these, a carboxy group is preferred from the viewpoint of resolution.

An acid value of the component (A) is preferably 30 to 150 mgKOH/g, more preferably 40 to 120 mgKOH/g, and still more preferably 50 to 100 mgKOH/g. When the acid value of the component (A) is the aforementioned lower limit value or more, there is a tendency that the solubility of the photosensitive resin composition in a dilute alkaline solution becomes more excellent, and when it is the aforementioned upper limit value or less, there is a tendency that the electric characteristics of the cured film are more improved.

The acid value of the component (A) can be calculated from the amount of a 0.1 mol/L potassium hydroxide aqueous solution required for neutralizing the resin.

A weight average molecular weight (Mw) of the component (A) is preferably 500 to 30,000, more preferably 1,000 to 25,000, and still more preferably 2,000 to 18,000. When the weight average molecular weight (Mw) of the component (A) falls within the aforementioned range, there is a tendency that the adhesion to an inner layer circuit, the heat resistance, and the insulation reliability are excellent. Here, in this specification, the weight average molecular weight is a value measured according to the following method.

<Measurement Method of Weight Average Molecular Weight>

As for the weight average molecular weight, a value obtained by performing the measurement using a GPC measurement apparatus as mentioned below and under a measurement condition as also mentioned below and converting the measured value using a calibration curve of standard polystyrene was defined as the weight average molecular weight. In addition, for preparing the calibration curve, 5 sample sets of standard polystyrene ("PStQuick MP-H" and "PStQuick B", manufactured by Tosoh Corporation) were used.

(GPC Measurement Apparatus)

GPC device: High-speed GPC device "HCL-8320GPC", with a differential refractometer or UV as the detector, manufactured by Tosoh Corporation Column: Column TSKgel SuperMultipore HZ-H (column length: 15 cm, column inner diameter: 4.6 mm), manufactured by Tosoh Corporation (Measurement Condition)

Solvent: Tetrahydrofuran (THF)

Measurement temperature: 40° C.

Flow rate: 0.35 mL/min

Sample concentration: 10 mg/5 mL of THF

Injection volume: 20 μL

The component (A) is preferably an acid-modified ethylenically unsaturated group-containing epoxy derivative obtained by allowing (A') a resin that is obtained through a reaction of (a) an epoxy resin and (b) an ethylenically unsaturated group-containing organic acid [hereinafter occasionally referred to as "component (A')"], to react with (c) a saturated group or unsaturated group-containing polybasic acid anhydride [hereinafter occasionally referred to simply as "polybasic acid anhydride (c)".

A suitable embodiment of the component (A) obtained from the epoxy resin (a), the ethylenically unsaturated group-containing organic acid (b), and the saturated or unsaturated group-containing polybasic acid anhydride (c) is hereunder described.

[(a) Epoxy Resin]

The epoxy resin (a) is preferably an epoxy resin having two or more epoxy groups. The epoxy resin is classified into a glycidyl ether type epoxy resin, a glycidyl amine type epoxy resin, a glycidyl ester type epoxy resin, and so on. Of these, a glycidyl ether type epoxy resin is preferred.

The component (a) may be used alone or may be used in combination of two or more thereof.

The epoxy resin (a) can be classified into various epoxy resins depending upon a difference of the main structure, and for example, it can be classified into an epoxy resin having a dicyclopentadiene structure, a bisphenol type epoxy resin, a novolak type epoxy resin, a triphenolmethane type epoxy resin, an aralkyl type epoxy resin, other epoxy resin, and so on.

Of these, an epoxy resin having a dicyclopentadiene structure, a novolak type epoxy resin, a bisphenol type epoxy resin, and a triphenolmethane type epoxy resin are preferred from the viewpoint of adhesion to an inner layer circuit.

From the viewpoint of adhesion to an inner layer circuit, the component (A) preferably contains (A1) an acid-modified ethylenically unsaturated group-containing epoxy derivative that is obtained using, as the epoxy resin (a), (a1) an epoxy resin having a dicyclopentadiene structure, and (A2) an acid-modified ethylenically unsaturated group-containing epoxy derivative that is obtained using, as the epoxy resin (a), (a2) at least one selected from the group consisting of a novolak type epoxy resin, a bisphenol type epoxy resin, and a triphenolmethane type epoxy resin.

The acid-modified ethylenically unsaturated group-containing epoxy derivative (A1) is one corresponding to the dicyclopentadiene structure-containing component (X) in the present embodiment.

A suitable embodiment of the epoxy resin (a) is hereunder more specifically described.

((a1) Component)

The component (a1) is an epoxy resin having a dicyclopentadiene structure.

From the viewpoint of making it possible to achieve alkaline development and improving the resolution and the adhesion to an inner layer circuit, the photosensitive resin composition of the present embodiment preferably contains, as the component (A), the acid-modified ethylenically unsaturated group-containing epoxy derivative (A1) that is obtained using the component (a1).

The component (a1) is preferably one having a structural unit represented by the following general formula (A-1).

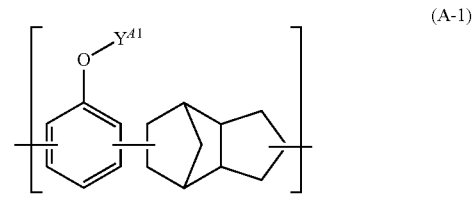

In the formula, $Y^{A1}$ is a glycidyl group.

The structural unit number of the structural unit in the epoxy resin having the structural unit represented by the general formula (A-1) is a number of 1 or more, preferably 1 to 10, and more preferably 3 to 7. When the structural unit number falls within the aforementioned range, there is a tendency that the resolution and the adhesion to an inner layer circuit are more improved.

Here, the structural unit number of the structural unit expresses an integer value in a single molecule and expresses a rational number that is an average value in an aggregate of plural kinds of molecules. The same is hereinafter applicable to the structural unit number of structural unit.

The epoxy resin having the structural unit represented by the general formula (A-1) is preferably one represented by the following general formula (A-2).

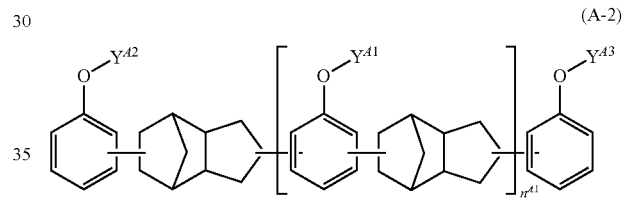

In the formula, $Y^{A1}$ is the same as defined above for the general formula (A-1); $Y^{A2}$ and $Y^{A3}$ are each independently a hydrogen atom, an alkyl group, or a glycidyl group; and $n^{A1}$ is a number of 1 or more.

In the general formula (A-2), $Y^{A2}$ and $Y^{A3}$ are preferably a glycidyl group from the viewpoint of improving the resolution and the adhesion to an inner layer circuit.

In the general formula (A-2), $n^{A1}$ is a number of 1 or more, preferably 1 to 10, and more preferably 3 to 7. When $n^{A1}$ falls within the aforementioned range, there is a tendency that the resolution and the adhesion to an inner layer circuit are more improved.

The epoxy resin represented by the general formula (A-2) (but one in which $Y^{A1}$, $Y^{A2}$, and $Y^{A3}$ are all a glycidyl group) is, for example, commercially available as HP-7200H (a trade name, manufactured by DIC Corporation) and XD-1000 (a trade name, manufactured by Nippon Kayaku Co., Ltd.).

As the component (a1), an epoxy resin represented by the following general formula (A-3) is also preferably exemplified.

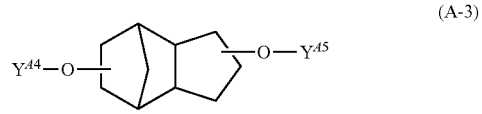

In the formula, $Y^{44}$ and $Y^{45}$ are each independently a hydrogen atom, an alkyl group, or a glycidyl group, provided that at least one of $Y^{44}$ and $Y^{45}$ is a glycidyl group.

In the general formula (A-3), $Y^{44}$ and $Y^{45}$ are preferably a glycidyl group from the viewpoint of improving the resolution and the adhesion to an inner layer circuit.

The epoxy resin represented by the general formula (A-3) (but one in which $Y^{44}$ and $Y^{45}$ are all a glycidyl group) is, for example, commercially available as ADEKA RESIN EP-4088S and EP-4088L (all of which are a trade name, manufactured by ADEKA CORPORATION).

((a2) Component)

The component (a2) is at least one selected from the group consisting of a novolak type epoxy resin, a bisphenol type epoxy resin, and a triphenolmethane type epoxy resin.

From the viewpoint of making it possible to achieve alkaline development and improving the resolution and the adhesion to an inner layer circuit, the photosensitive resin composition of the present embodiment preferably contains, as the component (A), the acid-modified ethylenically unsaturated group-containing epoxy derivative (A2) that is obtained using the component (a2).

The component (a2) is preferably a novolak type epoxy resin from the viewpoint of improving the resolution and the adhesion to an inner layer circuit.

Examples of the novolak type epoxy resin include bisphenol novolak type epoxy resins, such as a bisphenol A novolak type epoxy resin, a bisphenol F novolak type epoxy resin, and a bisphenol S novolak type epoxy resin; a phenol novolak type epoxy resin, a cresol novolak type epoxy resin, a biphenyl novolak type epoxy resin, and a naphthol novolak type epoxy resin.

From the viewpoint of improving the resolution and the adhesion to an inner layer circuit, the novolak type epoxy resin is preferably a bisphenol novolak type epoxy resin having a structural unit represented by the following general formula (A-4).

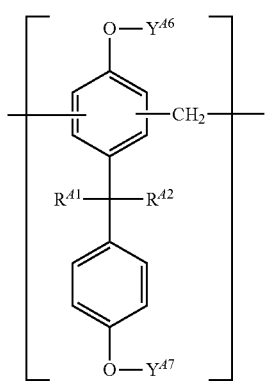

(A-4)

In the formula, $R^{41}$ and $R^{42}$ are each independently a hydrogen atom or a methyl group; and $Y^{46}$ and $Y^{47}$ are each independently a hydrogen atom, an alkyl group, or a glycidyl group, provided that at least one of $Y^{46}$ and $Y^{47}$ is a glycidyl group.

From the viewpoint of improving the resolution and the adhesion to an inner layer circuit, $R^{41}$ and $R^{42}$ are preferably a hydrogen atom.

From the same viewpoint, $Y^{46}$ and $Y^{47}$ are preferably a glycidyl group.

The structural unit number of the structural unit in the epoxy resin having the structural unit represented by the general formula (A-4) is a number of 1 or more, preferably 10 to 100, more preferably 15 to 80, and still more preferably 15 to 70. When the structural unit number falls within the aforementioned range, there is a tendency that the resolution and the adhesion to an inner layer circuit are more improved.

From the viewpoint of improving the resolution and the adhesion to an inner layer circuit, the novolak type epoxy resin is more preferably a bisphenol novolak type epoxy resin having a structural unit represented by the following general formula (A-5).

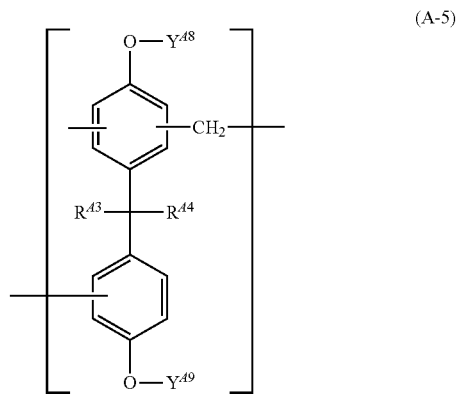

(A-5)

In the formula, $R^{43}$ and $R^{44}$ are each independently a hydrogen atom or a methyl group; and $Y^{48}$ and $Y^{49}$ are each independently a hydrogen atom, an alkyl group, or a glycidyl group, provided that at least one of $Y^{48}$ and $Y^{49}$ is a glycidyl group.

From the viewpoint of improving the resolution and the adhesion to an inner layer circuit, $R^{43}$ and $R^{44}$ are preferably a hydrogen atom.

From the same viewpoint, $Y^{48}$ and $Y^{49}$ are preferably a glycidyl group.

The structural unit number of the structural unit in the epoxy resin having the structural unit represented by the general formula (A-5) is a number of 1 or more, preferably 10 to 100, more preferably 15 to 80, and still more preferably 15 to 70. When the structural unit number falls within the aforementioned range, there is a tendency that the adhesion strength, the heat resistance, and the electrical insulation properties are more improved.

In the general formula (A-5), the epoxy resin in which $R^{43}$ and $R^{44}$ are a hydrogen atom, and $Y^{48}$ and $Y^{49}$ are a glycidyl group is, for example, commercially available as EXA-7376 Series (a trade name, manufactured by DIC Corporation); and the epoxy resin in which $R^{43}$ and $R^{44}$ are a hydrogen atom, and $Y^{48}$ and $Y^{49}$ are a glycidyl group is, for example, commercially available as EPON SU8 Series (a trade name, manufactured by Mitsubishi Chemical Corporation).

As the novolak type epoxy resin, a phenol novolak type epoxy resin having a structural unit represented by the following general formula (A-6) is also preferred.

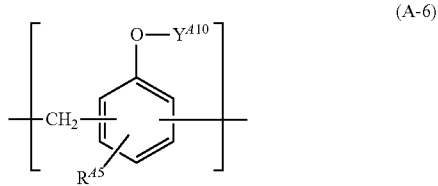

(A-6)

In the formula, $R^{45}$ is a hydrogen atom or a methyl group; and YAM is a glycidyl group.

The epoxy resin having the structural unit represented by the general formula (A-6) may be one containing the structural unit represented by the general formula (A-6) wherein YAM is a hydrogen atom. In this case, a molar ratio $[(U_H)/(U_G)]$ of a structural unit $(U_H)$ wherein YAM is a hydrogen atom to a structural unit $(U_G)$ wherein YAM is a glycidyl group is preferably 0/100 to 30/70, and more preferably 0/100 to 10/90 from the viewpoint of improving the resolution.

Examples of the epoxy resin having the structural unit represented by the general formula (A-6) include a phenol novolak type epoxy resin and a cresol novolak type epoxy resin. Such a novolak type epoxy resin can be, for example, obtained by allowing a phenol novolak resin or a cresol novolak resin to react with epichlorohydrin by a known method.

The phenol novolak type epoxy resin or cresol novolak type epoxy resin represented by the general formula (A-6) is, for example, commercially available as YDCN-701, YDCN-702, YDCN-703, YDCN-704, YDCN-704L, YDPN-638, and YDPN-602 (all of which are a trade name, manufactured by NIPPON STEEL Chemical & Material Co., Ltd.), DEN-431 and DEN-439 (all of which are a trade name, manufactured by The Dow Chemical Company), EOCN-120, EOCN-102S, EOCN-103S, EOCN-104S, EOCN-1012, EOCN-1025, EOCN-1027, and BREN (all of which are a trade name, manufactured by Nippon Kayaku Co., Ltd.), EPN-1138, EPN-1235, and EPN-1299 (all of which are a trade name, manufactured by BASF SE), and N-730, N-770, N-865, N-665, N-673, VH-4150, and VH-4240 (all of which are a trade name, manufactured by DIC Corporation).

Examples of the bisphenol type epoxy resin which is used as the component (a2) include a bisphenol A type epoxy resin, a bisphenol F type epoxy resin, a bisphenol S type epoxy resin, and 3,3',5,5'-tetramethyl-4,4'-diglycidyloxydiphenylmethane.

The bisphenol A type epoxy resin or bisphenol F type epoxy resin is, for example, commercially available as EPIKOTE 807, 815, 825, 827, 828, 834, 1001, 1004, 1007, and 1009 (all of which are a trade name, manufactured by Mitsubishi Chemical Corporation), DER-330, DER-301, and DER-361 (all of which are a trade name, manufactured by The Dow Chemical Company), and YD-8125, YDF-170, YDF-175S, YDF-2001, YDF-2004, and YDF-8170 (all of which are a trade name, manufactured by NIPPON STEEL Chemical & Material Co., Ltd.).

The triphenolmethane type epoxy resin which is used as the component (a2) is, for example, commercially available as FAE-2500, EPPN-501H, and EPPN-502H (all of which are a trade name, manufactured by Nippon Kayaku Co., Ltd.).

As the epoxy resin (a), other epoxy resin than the aforementioned component (a1) and component (a2) may also be used.

Examples of the other epoxy resin than the component (a1) and the component (a2) include aralkyl type epoxy resins, such as a phenol aralkyl type epoxy resin, a biphenyl aralkyl type epoxy resin, and a naphthol aralkyl type epoxy resin; a stilbene type epoxy resin, a naphthalene type epoxy resin, a naphthylene ether type epoxy resin, a biphenyl type epoxy resin, a dihydroanthracene type epoxy resin, a cyclohexane dimethanol type epoxy resin, a trimethylol type epoxy resin, an alicyclic epoxy resin, an aliphatic chain epoxy resin, a heterocyclic epoxy resin, a spiro ring-containing epoxy resin, a rubber-modified epoxy resin, and a hydrogenated bisphenol A type epoxy resin.

[(b) Ethylenically Unsaturated Group-Containing Organic Acid]

The ethylenically unsaturated group-containing organic acid (b) is not particularly limited so long as it is an organic acid containing an ethylenically unsaturated group.

Examples of the ethylenically unsaturated group which the component (b) has include those as the same ethylenically unsaturated group which the component (A) has. Of these, a (meth)acryloyl group is preferred from the viewpoint of reactivity and resolution.

Although the ethylenically unsaturated group-containing organic acid (b) is not particularly limited, it is preferably an ethylenically unsaturated group-containing monocarboxylic acid.

Examples of the ethylenically unsaturated group-containing monocarboxylic acid include acrylic acid; acrylic acid derivatives, such as a dimer of acrylic acid, methacrylic acid, β-furfurylacrylic acid, β-styrylacrylic acid, cinnamic acid, crotonic acid, and α-cyanocinnamic acid; half ester compounds that are a reaction product between a hydroxy group-containing acrylate and a dibasic acid anhydride; and half ester compounds that are a reaction product between a vinyl group-containing monoglycidyl ether or a vinyl group-containing monoglycidyl ester and a dibasic acid anhydride. Of these, acrylic acid is preferred.

The component (b) may be used alone or may be used in combination of two or more thereof.

The aforementioned half ester compound is, for example, obtained by allowing at least one ethylenically unsaturated group-containing compound selected from the group consisting of a hydroxy group-containing acrylate, a vinyl group-containing monoglycidyl ether, and a vinyl group-containing monoglycidyl ester to react with a dibasic acid anhydride. The foregoing reaction is preferably performed by reacting the ethylenically unsaturated group-containing compound and the dibasic acid anhydride in an equimolar ratio.

Examples of the hydroxy group-containing acrylate which is used for synthesis of the half ester compound include hydroxyethyl (meth)acrylate, hydroxypropyl (meth)acrylate, hydroxybutyl (meth)acrylate, polyethylene glycol (meth)monoacrylate, trimethylolpropane di(meth)acrylate, pentaerythritol tri(meth)acrylate, and dipentaerythritol penta(meth)acrylate.

Examples of the vinyl group-containing monoglycidyl ether include glycidyl (meth)acrylate.

The dibasic acid anhydride which is used for synthesis of the aforementioned half ester compound may be either one containing a saturated group or one containing an unsaturated group. Examples of the dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

In the reaction between the component (a) and the component (b), the use amount of the component (b) is preferably 0.6 to 1.05 equivalents, more preferably 0.7 to 1.02 equivalents, and still more preferably 0.8 to 1.0 equivalent relative to 1 equivalent of the epoxy group of the component (a). By reacting the component (a) and the component (b) at the aforementioned ratio, there is a tendency that the photopolymerizability is improved, and the resolution of the obtained photosensitive resin composition is improved.

It is preferred to react the component (a) and the component (b) upon being dissolved in an organic solvent.

Examples of the organic solvent include ketones, such as methyl ethyl ketone and cyclohexanone; aromatic hydrocarbons, such as toluene, xylene, and tetramethylbenzene; glycol ethers, such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters, such as ethyl acetate, butyl acetate, butyl cellosolve acetate, and carbitol acetate; aliphatic hydrocarbons, such as octane and decane; and petroleum-based solvents, such as petroleum ether, petroleum naphtha, hydrogenated petroleum naphtha, and solvent naphtha. The organic solvent may be used alone or may be used in combination of two or more thereof.

In order to promote the reaction between the component (a) and the component (b), it is preferred to use a catalyst for the purpose of promoting the reaction. Examples of the catalyst include amine-based catalysts, such as triethylamine and benzyl methylamine; quaternary ammonium salt catalysts, such as methyltriethylammonium chloride, benzyltrimethylammonium chloride, benzyltrimethylammonium bromide, and benzyltrimethylammonium iodide; and phosphine-based catalysts, such as triphenylphosphine. Of these, phosphine-based catalysts are preferred, and triphenyl phosphine is more preferred. The catalyst may be used alone or may be used in combination of two or more thereof.

In the case of using the catalyst, from the viewpoint of allowing the reaction to homogeneously proceed while obtaining sufficient reactivity, the use amount thereof is preferably 0.01 to 10 parts by mass, more preferably 0.05 to 5 parts by mass, and still more preferably 0.1 to 2 parts by mass based on 100 parts by mass of the total of the component (a) and the component (b).

For the purpose of preventing polymerization during the reaction between the component (a) and the component (b) from occurring, it is preferred to use a polymerization inhibitor. Examples of the polymerization inhibitor include hydroquinone, methyl hydroquinone, hydroquinone monomethyl ether, catechol, and pyrogallol. The polymerization inhibitor may be used alone or may be used in combination of two or more thereof.

In the case of using the polymerization inhibitor, from the viewpoint of improving the storage stability of the composition, the use amount thereof is preferably 0.01 to 1 part by mass, more preferably 0.02 to 0.8 parts by mass, and still more preferably 0.05 to 0.5 parts by mass based on 100 parts by mass of the total of the component (a) and the component (b).

From the viewpoint of allowing the reaction to homogeneously proceed while obtaining sufficient reactivity, a reaction temperature between the component (a) and the component (b) is preferably 60 to 150° C., more preferably 80 to 120° C., and still more preferably 90 to 110° C.

In the light of the above, it may be conjectured that the component (A') which is obtained by allowing the component (a) and the component (b) to react with each other is one having a hydroxy group formed through a ring-opening addition reaction between the epoxy group of the component (a) and the carboxy group of the component (b). Subsequently, by allowing the component (A') to further react with the component (c), the acid-modified ethylenically unsaturated group-containing epoxy derivative in which the hydroxy group of the component (A') (inclusive of the hydroxy group originally existing in the component (a)) and the acid anhydride group of the component (c) are half-esterified is obtained.

[(c) Polybasic Acid Anhydride]

The component (c) may be one containing a saturated group or may be one containing an unsaturated group. Examples of the component (c) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. Of these, tetrahydrophthalic anhydride is preferred from the viewpoint of resolution. The component (c) may be used alone or may be used in combination of two or more thereof.

In the reaction between the component (A') and the component (c), for example, by reacting 0.1 to 1.0 equivalent of the compound (c) relative to one equivalent of the hydroxy group in the component (A'), the acid value of the obtained component (A) can be controlled.

From the viewpoint of productivity, a reaction temperature between the component (A') and the component (c) is preferably 50 to 150° C., more preferably 60 to 120° C., and still more preferably 70 to 100° C.

As for the component (A), besides those mentioned above, for example, a styrene-maleic acid-based resin, such as a hydroxyethyl (meth)acrylate-modified product of a styrene-maleic anhydride copolymer, can be partly used in combination.

(Content of Component (A))

Although the content of the component (A) is not particularly restricted, from the viewpoint of more improving the heat resistance, the electrical characteristics, and the chemical resistance, it is preferably 5 to 60% by mass, more preferably 10 to 50% by mass, and still more preferably 15 to 40% by mass on the basis of the whole amount of the solid components of the photosensitive resin composition.

<(B) Photopolymerization Initiator>

The photosensitive resin composition of the present embodiment further contains a photopolymerization initiator as the component (B).

In view of the fact that the photosensitive resin composition of the present embodiment contains the photopolymerization initiator (B), there is a tendency that the photosensitivity is improved, and an exposed area hardly elutes during the development.

The photopolymerization initiator (B) is not particularly restricted so long as it is able to polymerize the component (A), and it can be appropriately selected from typically used photopolymerization initiators.

Examples of the photopolymerization initiator (B) include benzoins, such as benzoin, benzoin methyl ether, and benzoin isopropyl ether; acetophenones, such as acetophenone, 2,2-dimethoxy-2-phenylacetophenone, 2,2-diethoxy-2-phenylacetophenone, 1,1-dichloroacetophenone, 1-hydroxycyclohexylphenyl ketone, 2-benzyl-2-dimethylamino-1-(4-morpholinophenyl)-1-butanone, 2-methyl-1-[4-(methylthio)phenyl]-2-morpholino-1-propanone, and N,N-dimethylaminoacetophenone; anthraquinones, such as 2-methylanthraquinone, 2-ethylanthraquinone, 2-tert-butylanthraquinone, 1-chloroanthraquinone, 2-amylanthraquinone, and 2-aminoanthraquinone; thioxanthones, such as 2,4-dimethylthioxanthone, 2,4-diethylthioxanthone, 2-chlorothioxanthone, and 2,4-diisopropylthioxanthone; ketals, such as acetophenone dimethyl ketal and benzyldimethyl ketal; benzophenones, such as benzophenone, methylbenzophenone, 4,4'-dichlorobenzophenone, 4,4'-bis(diethylamino)benzophenone, Michler's ketone, and 4-benzoyl-4'-methyldiphenyl sulfide; acridines, such as 9-phenylacridine and 1,7-bis(9,9'-acridinyl)heptane; acyl phosphine oxides, such as 2,4,6-trimethylbenzoyldiphenyl phosphine oxide; and oxime esters, such as 1,2-octanedione-1-[4-(phenylthio)phenyl]-2-(O-benzoyloxime), ethanone, 1-[9-ethyl-6-(2-methylbenzoyl)-9H-carbazol-3-yl], 1-(O-acetyloxime), and 1-phenyl-1,2-propanedione-2-[O-ethoxycarbonyl]oxime].

Of these, acetophenones are preferred from the viewpoint that they are hardly volatilized and hardly generated as an outgas.

The component (B) may be used alone or may be used in combination of two or more thereof. In the case of using two or more compounds in combination, it is preferred to use an acetophenone, a thioxanthone, and an oxime ester in combination.

The photosensitive resin composition of the present embodiment may contain a photopolymerization initiation aid, such as ethyl N,N-dimethylaminobenzoate, isoamyl N,N-dimethylaminobenzoate, pentyl-4-dimethylaminobenzoate, triethylamine, and triethanolamine, together with the component (B).

(Content of Component (B))

Although the content of the component (B) is not particularly limited, it is preferably 0.2 to 15% by mass, more preferably 0.4 to 5% by mass, and still more preferably 0.6 to 1% y mass on the basis of the whole amount of the solid components of the photosensitive resin composition. When the content of the component (B) is the aforementioned lower limit value or more, in the interlayer insulating layer to be formed using the photosensitive resin composition, the possibility that an exposed site elutes during the development can be reduced, and when it is the aforementioned upper limit value or less, there is a tendency that the heat resistance is more improved.

<(C) Photopolymerizable Compound>

It is preferred that the photosensitive resin composition of the present embodiment further contains a photopolymerizable compound not having an acidic substituent as the component (C).

The component (C) is not particularly restricted so long as it is a photopolymerizable compound, and examples thereof include a monomer having one ethylenically unsaturated group, a monomer having two ethylenically unsaturated groups, and a polyfunctional monomer having three ethylenically unsaturated groups. Examples of the ethylenically unsaturated group which the component (C) has include those as the same ethylenically unsaturated group which the component (A) has, and a preferred embodiment thereof is also the same.

The component (C) may be used alone or may be used in combination of two or more thereof.

Examples of the component (C) include hydroxyalkyl (meth)acrylates, such as 2-hydroxyethyl (meth)acrylate and 2-hydroxypropyl (meth)acrylate; mono- or di(meth)acrylates of a glycol, such as ethylene glycol, methoxytetraethylene glycol, and polyethylene glycol; (meth)acrylamides, such as N,N-dimethyl (meth)acrylate and N-methylol (meth)acrylate; aminoalkyl (meth)acrylates, such as N,N-dimethylaminoethyl (meth)acrylate; polyvalent (meth)acrylates of a polyhydric alcohol or an ethylene oxide or propylene oxide adduct thereof, such as hexanediol, trimethylolpropane, pentaerythritol, ditrimethylolpropane, dipentaerythritol, and tris-hydroxyethyl isocyanate; (meth)acrylates of an ethylene oxide or propylene oxide adduct of a phenol, such as phenoxyethyl (meth)acrylate and polyethoxy di(meth)acrylate of bisphenol A; (meth)acrylates of a glycidyl ether, such as glycerin diglycidyl ether, trimethylolpropane triglycidyl ether, and triglycidyl isocyanurate; and melamine (meth)acrylate.

From the viewpoint of increasing a crosslinking density due to photo-curing to improve the heat resistance and the electrical reliability, the component (C) is preferably a polyfunctional monomer having three or more ethylenically unsaturated groups. As such a compound, the aforementioned polyvalent (meth)acrylates are exemplified, and dipentaerythritol tri(meth)acrylate is preferred from the viewpoint of improving the sensitivity.

From the viewpoint of adhesion to an inner layer circuit, the component (C) is preferably one including an alicyclic structure, and more preferably one including a dicyclopentadiene structure.

From the same viewpoint, the component (C) is preferably a di(meth)acrylate having an alicyclic structure, and more preferably a bifunctional (meth)acrylate having a dicyclopentadiene structure. Examples of the bifunctional (meth)acrylate having a dicyclopentadiene structure include tricyclodecanedimethanol dimethacrylate.

The bifunctional (meth)acrylate having a dicyclopentadiene structure is, for example, commercially available as FA-513M (a trade name, manufactured by Hitachi Chemical Company, Ltd.) and DCP and A-DCP (all of which are a trade name, manufactured by SHIN-NAKAMURA CHEMICAL CO, LTD.).

In the case where the photosensitive resin composition of the present embodiment contains a bifunctional (meth)acrylate having a dicyclopentadiene structure as the component (C), the foregoing bifunctional (meth)acrylate having a dicyclopentadiene structure is corresponding to the dicyclopentadiene structure-containing compound (X).

A molecular weight of the photopolymerizable compound (C) is preferably less than 1,000, more preferably 150 to 800, still more preferably 200 to 700, and especially preferably 250 to 600.

In the case where the photosensitive resin composition of the present embodiment contains the photopolymerizable compound (C), though the content of the photopolymerizable compound (C) is not particularly limited, it is preferably 2 to 50% by mass, more preferably 3 to 20% by mass, and still more preferably 3 to 10% by mass on the basis of the whole amount of the solid components of the photosensitive resin composition. When the content of the component (C) is the aforementioned lower limit value or more, there is a tendency that the photosensitivity is improved, and an exposed area hardly elutes during the development, and when it is the aforementioned upper limit value or less, there is a tendency that the heat resistance is more improved.

<(D) Thermosetting Resin>

It is preferred that the photosensitive resin composition of the present embodiment further contains a thermosetting resin as a component (D). However, it should be construed that those corresponding to the component (A) and the component (B) are not included in the component (D).

In view of the fact that the photosensitive resin composition of the present embodiment contains the thermosetting resin (D), there is a tendency that not only the resolution and the adhesion to an inner layer circuit are improved, but also the heat resistance is more improved.

The component (D) may be used alone or may be used in combination of two or more thereof.

Examples of the thermosetting resin (D) include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. In addition, the thermosetting resin is not particularly restricted to these resins, and known thermosetting resins can be used. Of these, an epoxy resin is preferred.

The epoxy resin is preferably an epoxy resin having two or more epoxy groups. The epoxy resin is classified into a glycidyl ether type epoxy resin, a glycidyl amine type epoxy resin, a glycidyl ester type epoxy resin, and so on. Of these, a glycidyl ether type epoxy resin is preferred.

The epoxy resin is also classified into various epoxy resins depending upon a difference of the main structure, and in the aforementioned epoxy resins of respective types, the epoxy resin is further classified as follows. Specifically, the epoxy resin is classified into bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the bisphenol-based novolak type epoxy resins, such as a phenol novolak type epoxy resin, a cresol novolak type epoxy resin, and a biphenyl novolak type epoxy resin; phenol aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; biphenyl aralkyl type epoxy resins; xylylene type epoxy resins; dihydroanthracene type epoxy resins; dicyclopentadiene type epoxy resins; alicyclic epoxy resins; heterocyclic epoxy resins; spiro ring-containing epoxy resins; cyclohexanedimethanol type epoxy resins; trimethylol type epoxy resins; aliphatic chain epoxy resins; rubber-modified epoxy resins; and so on.

Of these, from the viewpoint of improving the heat resistance, bisphenol-based epoxy resins, naphthol type epoxy resins, naphthalene type epoxy resins, biphenyl type epoxy resins, and naphthylene ether type epoxy resins are preferred; a bisphenol A type epoxy resin, a bisphenol F type epoxy resin, and a biphenyl type epoxy resin are more preferred; a bisphenol F type epoxy resin and a biphenyl type epoxy resin are still more preferred; and a biphenyl type epoxy resin is especially preferred.

As for these epoxy resins, commercially available products can be used. Examples thereof include a bisphenol A type epoxy resin (e.g., "jER828EL" and "YL980", manufactured by Mitsubishi Chemical Corporation), a bisphenol F type epoxy resin (e.g., "iER806H" and "YL983U", manufactured by Mitsubishi Chemical Corporation), a naphthalene type epoxy resin (e.g., "HP4032D" and "HP4710", manufactured by DIC Corporation), a naphthalene structure-containing type polyfunctional epoxy resin (e.g., "NC7000", manufactured by Nippon Kayaku Co., Ltd.), a naphthol type epoxy resin (e.g., "ESN-475V", manufactured by NIPPON STEEL Chemical & Material Co., Ltd.), an epoxy resin having a biphenyl structure (e.g., "NC3000H" and "NC3500", manufactured by Nippon Kayaku Co., Ltd., and "YX4000HK" and "YL6121", manufactured by Mitsubishi Chemical Corporation), an anthracene type epoxy resin (e.g., "YX8800", manufactured by Mitsubishi Chemical Corporation), a glycerol type epoxy resin (e.g., "ZX1542", manufactured by NIPPON STEEL Chemical & Material Co., Ltd.), and a naphthylene ether type epoxy resin (e.g., "EXA7311-G4", manufactured by DIC Corporation).

From the viewpoint of improving the adhesion to an inner layer circuit, a dicyclopentadiene type resin is also preferred as the component (D).

A preferred embodiment of the dicyclopentadiene type epoxy resin is the same as the embodiment described above for the epoxy resin (a1), and examples of a commercially available product thereof are the same as those exemplified as the component (a1).

In the case where the photosensitive resin composition of the present embodiment contains the dicyclopentadiene type epoxy resin as the component (D), the foregoing dicyclopentadiene type epoxy resin is corresponding to the dicyclopentadiene structure-containing compound (X).

Besides those exemplified above, an epoxy-modified polybutadiene [hereinafter occasionally referred to as "epoxidized polybutadiene"] can be used as the epoxy resin. In particular, as for the component (D), from the viewpoint of handling properties during production of a printed wiring board, it is preferred to use an aromatic epoxy resin that is solid at room temperature and an epoxy resin that is liquid at room temperature in combination. From this viewpoint, an embodiment in which the aforementioned epoxy resin exemplified as a preferred epoxy resin (the aromatic epoxy resin that is solid at room temperature) is used in combination with the epoxy-modified polybutadiene (the epoxy resin that is liquid at room temperature) is preferred. In this case, a content ratio of the both to be used in combination [(aromatic epoxy resin that is solid at room temperature)/(epoxy resin that is liquid at room temperature)] is preferably 95/5 to 60/40, more preferably 95/5 to 70/30, and still more preferably 90/10 to 75/25 in terms of a mass ratio.

The epoxy-modified polybutadiene is preferably one having a hydroxy group at a molecular terminal, more preferably one having a hydroxy group at both molecular terminals, and still more preferably one having a hydroxy group at only both molecular terminals. In addition, though the number of hydroxy group which the epoxy-modified polybutadiene has is not particularly restricted so long as it is 1 or more, it is preferably 1 to 5, more preferably 1 or 2, and still more preferably 2.

From the viewpoint of adhesion to an inner layer circuit, heat resistance, thermal expansion coefficient, and softness, the epoxy-modified polybutadiene is preferably an epoxy-modified polybutadiene represented by the following general formula (D-1).

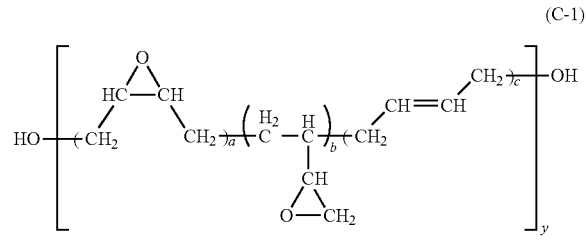

(C-1)

In the formula, a, b, and c each represent a ratio of the structural unit within the parenthesis; a is 0.05 to 0.40, b is 0.02 to 0.30, and c is 0.30 to 0.80; and a, b, and c are satisfied with not only (a+b+c)=1.00 but also (a+c)>b; and y represents a number of the structural unit within the parenthesis and is an integer of 10 to 250.

In the general formula (D-1), the binding order of the respective structural units within the parentheses is not in order. Namely, the structural unit expressed in the left, the structural unit expressed in the center, and the structural unit expressed in the right may pass each other, and when they are expressed as (a), (b), and (c), respectively, there may be various binding orders, such as -[(a)-(b)-(c)]-[(a)-(b)-(c)-]-, -[(a)-(c)-(b)]-[(a)-(c)-(b)-]-, -[(b)-(a)-(c)]-[(b)-(a)-(c)-]-, -[(a)-(b)-(c)]-[(c)-(b)-(a)-]-, -[(a)-(b)-(a)]-[(c)-(b)-(c)-]-, and -[(c)-(b)-(c)]-[(b)-(a)-(a)-]-.

From the viewpoint of adhesion to an inner layer circuit, heat resistance, thermal expansion coefficient, and softness, a is preferably 0.10 to 0.30, b is preferably 0.10 to 0.30, and c is preferably 0.40 to 0.80. In addition, from the same viewpoint, y is preferably an integer of 30 to 180.

In the general formula (D-1), examples of a commercially available product of the epoxidized polybutadiene in which a is 0.20, b is 0.20, c is 0.60, and y is an integer of 10 to 250 include "EPOLEAD (registered trademark) PB3600" (manufactured by Daicel Corporation).

(Content of Component (D))

In the case where the photosensitive resin composition of the present embodiment contains the component (D), though the content of the component (D) is not particularly restricted, it is preferably 5 to 70% by mass, more preferably 5 to 40% by mass, still more preferably 7 to 30% by mass, and especially preferably 10 to 20% by mass on the basis of the whole amount of the solid components of the photosensitive resin composition. When the content of the component (D) is the aforementioned lower limit value or more, sufficient crosslinking of the photosensitive resin composition is obtained, and there is a tendency that the adhesion to an inner layer circuit and the electrical insulation reliability are improved. On the other hand, when the content of the component (D) is the aforementioned upper limit value or less, there is a tendency that the resolution becomes favorable.

<(E) Pigment>

The photosensitive resin composition of the present embodiment may further contain a pigment as a component (E).

In view of the fact that the photosensitive resin composition of the present embodiment contains the pigment (E), the photosensitivity can be controlled.

A colorant capable of providing a desired color may be appropriately selected and used as the component (E), and examples thereof include known colorants, such as phthalocyanine blue, phthalocyanine green, iodine green, diazo yellow, crystal violet, titanium oxide, carbon black, and naphthalene black.

The pigment (E) may be used alone or may be used in combination of two or more thereof.

(Content of Pigment (E))

In the case where the photosensitive resin composition of the present embodiment contains the pigment (E), though the content of the pigment (E) is not particularly limited, it is preferably 0.01 to 5% by mass, more preferably 0.03 to 3% by mass, and still more preferably 0.05 to 2% by mass on the basis of the whole amount of the solid components of the photosensitive resin composition from the viewpoint of controlling the photosensitivity, etc.

<(F) Inorganic Filler>

It is preferred that the photosensitive resin composition of the present embodiment further contains an inorganic filler as a component (F). In view of the fact that the photosensitive resin composition of the present invention contains the inorganic filler (F), the thermal-expansion reduction can be achieved, and a fear to generate warpage can be reduced.

Examples of the component (F) include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), magnesium carbonate ($MgCO_3$), aluminum hydroxide ($Al(OH)_3$), magnesium hydroxide ($Mg(OH)_2$), lead titanate ($PbO.TiO_2$), lead zirconate titanate (PZT), lead lanthanum zirconate titanate (PLZT), gallium oxide ($Ga_2O_3$), spinel ($MgO.Al_2O_3$), mullite ($3Al_2O_3.2SiO_2$), cordierite ($2MgO.2Al_2O_3/5SiO_2$), talc ($3MgO.4SiO_2.H_2O$), aluminum titanate ($TiO_2.Al_2O_3$), yttria-containing zirconia ($Y_2O_3.ZrO_2$), barium silicate ($BaO.8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgO.TiO_2$), hydrotalcite, mica, fired kaolin, and carbon. The component (F) may be used alone or may be used in combination of two or more thereof.

From the viewpoint of resolution, an average particle diameter of the inorganic filler (F) is preferably 0.01 to 5 μm, more preferably 0.1 to 3 μm, still more preferably 0.3 to 2 μm, and especially preferably 0.5 to 1.5 μm.

Here, the average particle diameter of the inorganic fillert (F) is a volume average particle diameter of the inorganic filler in a dispersed state in the photosensitive resin composition and is a value obtained through the following measurement. First, the photosensitive resin composition is diluted (or dissolved) with methyl ethyl ketone 1,000 times, particles dispersed in the solvent are measured with a submicron particle analyzer (a trade name: N5, manufactured by Beckman Coulter, Inc.) at a refractive index of 1.38 in conformity with International Standard ISO13321, and a particle diameter at an integrated value of 50% (volume basis) in the particle size distribution is defined as the average particle diameter (volume average particle diameter). In addition, with respect to the inorganic filler (F) which is contained in the photosensitive resin film and the interlayer insulating layer provided on a carrier film, the average particle diameter can be measured by diluting (or dissolving) it with the aforementioned solvent 1,000 times (volume ratio) and then performing the measurement with the aforementioned submicron particle analyzer.

From the viewpoint of improving the dispersibility in the photosensitive resin composition due to the effect of preventing aggregation, it is preferred that the inorganic filler (F) is previously surface-treated with alumina or an organic silane-based compound. In addition, the surface roughness of the cured product having been subjected to a roughening treatment or a desmearing treatment can be made much smaller through the surface treatment, and a much finer wiring can be formed due to the surface of the cured product.

(Content of Inorganic Filler (F))

In the case where the photosensitive resin composition of the present embodiment contains the inorganic filler (F), though the content of the inorganic filler (F) is not particularly restricted, it is preferably 10 to 80% by mass, more preferably 12 to 70% by mass, still more preferably 15 to 65% by mass, and especially preferably 18 to 60% by mass on the basis of the whole amount of the solid components of the photosensitive resin composition. When the content of the inorganic filler (F) falls within the aforementioned range, the mechanical strength, the heat resistance, the resolution, and so on can be improved.

<(G) Elastomer>

It is preferred that the photosensitive resin composition of the present embodiment further contains an elastomer as a component (G).

In view of the fact that the photosensitive resin composition of the present embodiment contains the elastomer (G), there is a tendency that the resolution, the adhesion to an inner layer circuit, and the electrical insulation reliability are more excellent. In addition, due to the component (G), there is also brought an effect for inhibiting a reduction in flexibility and adhesion to an inner layer circuit to be caused due to a strain (internal stress) inside the cured product through curing shrinkage of the component (A).

The component (G) is preferably an elastomer that is liquid at 25° C.

The component (G) may be used alone or may be used in combination of two or more thereof.

Examples of the elastomer (G) include a styrenic elastomer, an olefinic elastomer, a urethane-based elastomer, a polyester-based elastomer, a polyamide-based elastomer, an acrylic elastomer, and a silicone-based elastomer. Such an elastomer is composed of a hard segment component and a soft segment component, and in general, the former contributes to the heat resistance and the strength, whereas the latter contributes to the softness and the toughness.

Of these, a polyester-based elastomer is preferred.

Examples of the polyester-based elastomer include ones obtained by polycondensing a dicarboxylic acid or a derivative thereof with a diol compound or a derivative thereof. The polyester-based elastomer may be used alone or may be used in combination of two or more thereof.

Examples of the dicarboxylic acid include aromatic dicarboxylic acids, such as terephthalic acid, isophthalic acid, and naphthalene dicarboxylic acid; aromatic dicarboxylic acids in which a hydrogen atom of the aromatic ring of the aforementioned aromatic dicarboxylic acid is substituted with a methyl group, an ethyl group, a phenyl group, or the like; aliphatic dicarboxylic acids having 2 to 20 carbon atoms, such as adipic acid, sebacic acid, and dodecane dicarboxylic acid; and alicyclic dicarboxylic acids, such as cyclohexane dicarboxylic acid. As for the dicarboxylic acid, from the viewpoint of adhesion to a base material, it is also preferred to use a dimer acid derived from a natural product. The dicarboxylic acid may be used alone or may be used in combination of two or more thereof.

Examples of the dicarboxylic acid derivative include acid anhydrides of the aforementioned dicarboxylic acids.

Examples of the diol compound include aliphatic diols, such as ethylene glycol, 1,3-propanediol, 1,4-butanediol, 1,6-hexanediol, and 1,10-decanediol; alicyclic diols, such as 1,4-cyclohexane diol; and aromatic diols, such as bisphenol A, bis(4-hydroxyphenyl)methane, bis(4-hydroxy-3-methylphenyl)propane, and resorcin. The diol compound may be used alone or may be used in combination of two or more thereof.

Furthermore, as the polyester-based elastomer, a multi-block copolymer containing an aromatic polyester (for example, polybutylene terephthalate) moiety as a hard segment component and an aliphatic polyester (for example, polytetramethylene glycol) moiety as a soft segment component can also be used, and it is preferred to use the foregoing multi-block copolymer. As the multi-block copolymer, there are commercially available products of various grades depending upon differences in the type, the ratio, and the molecular weight of the hard segment and the soft segment. Specifically, examples thereof include "HYTREL (a registered trademark)" (manufactured by DU PONT-TORAY CO., LTD.), "PELPRENE (a registered trademark)" (manufactured by Toyobo Co., Ltd.), and "ESPEL (a registered trademark)" (manufactured by Hitachi Chemical Company, Ltd.).

A number average molecular weight of the polyester-based elastomer is 900 to 30,000, more preferably 1,000 to 25,000, and still more preferably 5,000 to 20,000.

As the polyester-based elastomer, a commercially available product may be used. As other commercially available product than those mentioned above, TESLAC 2505-63 (manufactured by Hitachi Chemical Company, Ltd.; "TESLAC" is a registered trademark), and so on are commercially available.

(Content of Component (G))

In the case where the photosensitive resin composition of the present embodiment contains the component (G), though the content of the component (G) is not particularly limited, it is preferably 1 to 20% by mass, more preferably 2 to 15% by mass, and still more preferably 3 to 10% by mass on the basis of the whole amount of the solid components of the photosensitive resin composition. When the content of the elastomer (G) falls within the aforementioned range, there is a tendency that the resistance to thermal shock and the adhesion to an inner layer circuit are more improved while maintaining the favorable developability. In addition, in the case of being used for a thin-film substrate, the warpage of the thin-film substrate can be reduced.

<(H) Epoxy Resin Curing Agent>

The photosensitive resin composition of the present embodiment may further contain an epoxy resin curing agent as a component (H).

In view of the fact that the photosensitive resin composition of the present embodiment contains the epoxy resin curing agent (H), there is a tendency that various characteristics, such as heat resistance, adhesion strength, and chemical resistance, are more improved.

Examples of the epoxy resin curing agent (H) include imidazole derivatives, such as 2-methylimidazole, 2-ethyl-4-methylimidazole, 1-benzyl-2-methylimidazole, 2-phenylimidazole, and 2-phenyl-4-methyl-5-hydroxymethylimidazole; guanamines, such as acetoguanamine and benzoguanamine; polyamines, such as diaminodiphenylmethane, m-phenylenediamine, m-xylenediamine, diaminodiphenylsulfone, dicyandiamide, urea, a urea derivative, melamine, and a polybasic hydrazide; organic acid salts or epoxy adducts thereof; amine complexes, such as boron trifluoride; and triazine derivatives, such as ethyldiamino-S-triazine, 2,4-diamino-S-triazine, and 2,4-diamino-6-xylyl-S-triazine.

The epoxy resin curing agent (H) may be used alone or may be used in combination of two or more thereof.

(Content of Component (H))

In the case where the photosensitive resin composition of the present embodiment contains the component (H), though the content of the component (H) is not particularly limited, from the viewpoint of more suppressing the influences against the photosensitive characteristics, it is preferably 0.01 to 20% by mass, more preferably 0.1 to 10% by mass, and still more preferably 0.1 to 3% by mass on the basis of the whole amount of the solid components of the photosensitive resin composition. When the content of the elastomer (H) falls within the aforementioned range, the resistance to thermal shock and the adhesion to an inner layer circuit can be more improved while maintaining the favorable developability. In addition, in the case of being used for a thin-film substrate, the warpage of the thin-film substrate can be reduced.

As mentioned above, though the photosensitive resin composition of the present embodiment preferably contains at least one selected from the group consisting of the component (C), the component (D), the component (E), the component (F), the component (G), and the component (H), it may also be one not containing the component (C), the component (D), the component (E), the component (F), the component (G), or the component (H) according to the desired performance.

<Diluent>

If desired, a diluent can be used in the photosensitive resin composition of the present embodiment. As the diluent, for example, an organic solvent, etc. can be used. Examples of the organic solvent include ketones, such as methyl ethyl ketone and cyclohexanone; aromatic hydrocarbons, such as toluene, xylene, and tetramethylbenzene; glycol ethers, such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters, such as ethyl acetate, butyl acetate, propylene glycol monoethyl ether acetate, butyl cellosolve acetate, and carbitol acetate; aliphatic hydrocarbons, such as octane and decane; and petroleum solvents, such as petroleum ether, petroleum naphtha, hydrogenated petroleum naphtha, and solvent naphtha. The diluent may be used alone or may be used in combination of two or more thereof.

(Content of Diluent)

The content of the diluent may be appropriately selected such that the concentration of the whole amount of the solid components in the photosensitive resin composition is preferably 45 to 90% by mass, more preferably 50 to 80% by mass, and still more preferably 55 to 70% by mass. When the content of the diluent falls within the aforementioned range, the coatability of the photosensitive resin composition is improved, thereby making it possible to form a higher-resolution pattern.

However, the photosensitive resin composition of the present embodiment may also be one not containing the diluent.

<Other Additives>

If desired, the photosensitive resin composition of the present embodiment can contain various known common additives, such as a polymerization inhibitor, e.g., hydroquinone, methylhydroquinone, hydroquinone monomethyl ether, catechol, and pyrogallol; a tackifier, e.g., bentone and montmorillonite; a defoaming agent, e.g., a silicone-based defoaming agent, a fluorine-based defoaming agent, and a vinyl resin-based defoaming agent; and a silane coupling agent. Furthermore, the photosensitive resin composition of the present embodiment can also contain a flame retardant, such as a brominated epoxy compound, an acid-modified brominated epoxy compound, an antimony compound, a phosphate compound of a phosphorus-based compound, an aromatic condensed phosphate ester, and a halogen-containing condensed phosphate ester. However, the photosensitive resin composition of the present embodiment may also be one not containing such additives.

The photosensitive resin composition of the present embodiment can be produced by kneading and mixing the respective components in a roll mill, a bead mill, etc.

Here, the photosensitive resin composition of the present embodiment may be used in a liquid state or may be used in a film state.

In the case of using in a liquid state, though the coating method of the photosensitive resin composition of the present embodiment is not particularly restricted, examples thereof include various coating methods, such as a printing method, a spin coating method, a spray coating method, a jet dispense method, an ink jet method, and an immersion coating method. Of these, the coating method may be appropriately selected from a printing method and a spin coating method from the viewpoint of more easily forming the photosensitive layer.

In the case of using in a film state, for example, the photosensitive resin composition of the present embodiment can be used in the form of a photosensitive resin film as mentioned later. As for the photosensitive resin film, the photosensitive layer can be formed by laminating on a substrate using a laminator, etc. The method of using in a film state is preferred because the production efficiency of a multilayer printed wiring board becomes high.

[Photosensitive Resin Film and Photosensitive Resin Film for Interlayer Insulating Layer]

The photosensitive resin film of the present embodiment is one formed of the photosensitive resin composition of the present embodiment. The photosensitive resin film of the present embodiment may also be an embodiment in which the photosensitive resin film is provided on a carrier film.

Although a thickness (thickness after drying) of the photosensitive film (photosensitive layer) is not particularly limited, it is preferably 1 to 100 μm, more preferably 1 to 50 μm, and still more preferably 5 to 40 μm from the viewpoint of thinning of the printed wiring board.

The photosensitive resin film of the present embodiment can be, for example, produced by coating the photosensitive resin composition of the present embodiment on a carrier film, followed by drying. As a coating apparatus, a known coating apparatus, such as a comma coater, a bar coater, a kiss coater, a roll coater, a gravure coater, and a die coater, can be used.

Examples of the carrier film include polyesters, such as polyethylene terephthalate and polybutylene terephthalate; and polyolefins, such as polypropylene and polyethylene. A thickness of the carrier film is, for example, 5 to 100 μm, preferably 5 to 60 μm, and more preferably 15 to 45 μm.

The photosensitive resin film of the present embodiment can also be provided with a protective film on a surface of the photosensitive layer, which is located at the opposite side to a surface thereof coming into contact with the carrier film. As the protective film, a polymer film of, for example, polyethylene or polypropylene, or the like can be used. In addition, a polymer film the same as the aforementioned carrier film may be used, or a different polymer film may also be used.

The coating film to be formed by coating the photosensitive resin composition can be dried with a drier using hot air, far-infrared rays, or near-infrared rays. A drying temperature is preferably 60 to 150° C., more preferably 70 to 120° C., and still more preferably 80 to 100° C. In addition, a drying time is preferably 1 to 60 minutes, more preferably 2 to 30 minutes, and still more preferably 5 to 20 minutes. The content of the remaining diluent in the photosensitive resin film after drying is preferably 3% by mass or less, more preferably 2% by mass or less, and still more preferably 1% by mass or less from the viewpoint of avoiding the diluent from diffusion in the production process of a printed wiring board.

Since the photosensitive resin film of the present embodiment is excellent in resolution, adhesion to an inner layer circuit, and electrical insulation reliability, it is suited as the interlayer insulating layer of the multilayer printed wiring board. Namely, the present invention also provides a photosensitive resin film for interlayer insulating layer. The photosensitive resin film for interlayer insulating layer can also be referred to as an interlayer insulating photosensitive film.

[Printed Wiring Board and Method for Producing Same]

The printed wiring board of the present embodiment is a printed wiring board containing a surface protective film or an interlayer insulating layer that is formed using the photosensitive resin composition of the present embodiment or the photosensitive resin film of the present embodiment.

The printed wiring board of the present embodiment can be produced by a method including a step of providing a photosensitive layer using the photosensitive resin composition of the present embodiment or the photosensitive resin film of the present embodiment on a substrate; a step of forming a resin pattern using the photosensitive layer; and a step of curing the resin pattern to form at least one of a surface protective film and an interlayer insulating layer in this order.

An example of the production method of the printed wiring board of the present embodiment is hereunder described while appropriately referring to FIG. 1.

First, the photosensitive layer is formed on a metal-cladded laminate substrate, such as a copper-cladded laminate board, by a method of coating the photosensitive resin composition or a method of laminating the photosensitive resin film.

Examples of the method of coating the photosensitive resin composition include a screen printing method, a spray method, a roll coating method, a curtain coating method, and an electrostatic spray coating method. A thickness during coating is preferably 1 to 100 μm, more preferably 1 to 50 μm, and still more preferably 5 to 40 μm in terms of a film thickness after drying. In addition, a drying temperature after coating is, for example, 60 to 110° C. The lamination of the photosensitive resin film may be performed through heat lamination with a known laminator.

Subsequently, the photosensitive layer is brought into direct contact with a negative film (or in a non-contact state via a transparent film, such as a carrier film), an actinic light is irradiated at an exposure dose of, for example, 10 to 2,000 mJ/cm$^2$, preferably 100 to 1,500 mJ/cm$^2$, and more preferably 300 to 1,000 mJ/cm$^2$, and then, an unexposed area is dissolved and removed (developed) with a dilute alkaline aqueous solution to form a pattern. Examples of the actinic light used include electron beams, ultraviolet rays, and X-rays, with ultraviolet rays being preferred. In addition, as a light source, a low pressure mercury lamp, a high pressure mercury lamp, an ultrahigh pressure mercury lamp, a halogen lamp, and so on can be used.

Subsequently, the exposed portion of the photosensitive layer is thoroughly cured through at least one treatment of post-exposure (ultraviolet exposure) and post-heating, to form at least one of a surface protective film and an interlayer insulating layer.

An exposure dose of the post-exposure is, for example, 100 to 5,000 mJ/cm$^2$, preferably 500 to 2,000 mJ/cm$^2$, and more preferably 700 to 1,500 mJ/cm$^2$.

A heating temperature of the post-heating is, for example, 100 to 200° C., preferably 120 to 180° C., and more preferably 135 to 165° C.

A heating time of the post-heating is, for example, 5 minutes to 12 hours, preferably 10 minutes to 6 hours, and more preferably 30 minutes to 2 hours.

Thereafter, a conductor pattern is formed through etching, whereby the printed wiring board is fabricated.

A multilayer printed wiring board can also be produced using the photosensitive resin composition of the present embodiment or the photosensitive resin film of the present embodiment.

FIG. 1 is a schematic view showing an embodiment of the production process of a multilayer printed wiring board using a cured product of the photosensitive resin composition of the present embodiment as at least one of a surface protective film and an interlayer insulating layer.

In a multilayer printed wiring board 100A shown in FIG. 1(f), plural conductor patterns 107 are provided in a stratiform state on a substrate having a conductor pattern 102 on a surface thereof, and an interlayer insulating layer 103 is provided between the respective layers. The conductor patterns 102 on the substrate and the conductor patterns 107 of each layer are connected with each other via openings 104. A surface protective film 108 is provided on the surface of the multilayer printed wiring board, and at least one of the surface protective film 108 and the interlayer insulating layer 103 is formed using the photosensitive resin composition of the present embodiment or the photosensitive resin film of the present embodiment.

The multilayer printed wiring board 100A is, for example, obtained by laminating a copper-cladded laminate, an interlayer insulating material, a metal foil, etc. and also appropriately forming a conductor pattern by an etching method or a semi-additive method. The production method of the multilayer printed wiring board 100A is hereunder simply described on the basis of FIG. 1.

First, the interlayer insulating layer 103 is formed on the both surfaces of a copper-cladded laminate 101 having the conductor patterns 102 on the both surfaces (see FIG. 1(a)). The interlayer insulating layer 103 is formed by the method described for the production method of a printed wiring board, namely coating the photosensitive resin composition of the present embodiment, or thermally laminating the photosensitive resin film of the present embodiment using a laminator to form a photosensitive layer, exposing the photosensitive layer on an area other than a place necessary for electrically connecting with the exterior (conductor pattern of another layer) by using a negative film, exposing, curing, and further removing the unexposed part (see FIG. 1(b)). This interlayer insulating layer 103 becomes a film having the openings 104. Here, a smear (residue) existing in the periphery of the opening 104 may be removed by a desmear treatment or plasma etching.

Subsequently, the conductor pattern 107 is formed. The conductor pattern 107 can be, for example, formed by the semi-additive method in which a thin metal layer (seed layer) is formed; a resin pattern (plated resist) is formed; subsequently, a conductor layer is formed by an electroplating method; the resin pattern is removed; and the seed layer is removed by means of etching. Specifically, a seed layer 105 is formed on the interlayer insulating layer 103 and on the conductor pattern 102 in the opening 104 by a sputtering method (see FIG. 1(c)). This seed layer 105 can be, for example, formed of plated copper by means of sputtering. On this seed layer 105, a photosensitive layer is formed using a photosensitive resin composition for semi-additive, and the photosensitive layer is exposed in a predetermined place and subjected to a development treatment using a negative film, thereby forming a resin pattern 106 having a predetermined pattern (see FIG. 1(d)).

Subsequently, in a portion of the seed layer 105 in which the resin pattern 106 is not formed, the conductor pattern 107 is formed by an electroplating method, the resin pattern 106 is removed with a stripping liquid, and the seed layer 105 is removed by means of etching (see FIG. 1(e)).

The operations of FIGS. 1(b) to 1(e) are repeatedly performed to form the conductor pattern 107 according to the desired layer number; and the surface protective film (permanent mask resist) 108 formed of a cured product of the photosensitive resin composition according to the present embodiment is formed on the outermost surface, whereby the multilayer printed wiring board 100A can be fabricated (see FIG. 1(f)). Here, as the photosensitive resin composition for semi-additive, for example, the photosensitive resin composition according to the present embodiment can be used.

In the thus-obtained multilayer printed wiring board 100A, a semiconductor element is mounted in a corresponding place, thereby making it possible to ensure the electrical connection.

In the view of the fact that the printed wiring board according to the present embodiment uses the photosensitive resin composition according to the present embodiment or the photosensitive resin film formed of the foregoing photosensitive resin composition for at least one of the surface protective film and the interlayer insulating layer, it enjoys the advantages which the photosensitive resin composition according to the present embodiment has, namely excellent adhesion to an inner layer circuit and resolution.

Following the flow of miniaturization and high performance of electronic devices, the tendency toward the increase in density owing to pitch narrowing of the conductor pattern is remarkable, and as a semiconductor mounting method corresponding thereto, a flip-chip connection mode of joining a semiconductor chip and a substrate by solder bump is the mainstream. However, there have hitherto been involved some problems as mentioned below.

The flip-chip connection mode is a semiconductor mounting mode by a reflow mode for arranging solder balls between the substrate and the semiconductor chip and heating the whole thereof to achieve fused junction. Accordingly, there was a case where the substrate itself is exposed in the high-temperature environment during solder reflow, and a large stress is generated in the solder balls connecting the substrate and the semiconductor to each other due to thermal shrinkage of the substrate, thereby causing a connection failure of the conductor pattern and a fracture (crack) in the surface protective film or underfill. In addition, there was a case where when the substrate is exposed in the high-temperature environment, a large stress is generated on the connection interface due to heat expansion of the resin composition forming the surface protective film, etc. provided on the substrate, thereby causing a connection failure. The photosensitive resin composition according to the present embodiment has excellent heat resistance in addition to excellent adhesion to an inner layer circuit, resolution, and adhesion to a chip component, and sufficiently has performances capable of solving these problems. Accordingly, the printed wiring board according to the present embodiment has such a high quality that a connection failure of the conductor pattern and a fracture, etc. of the surface protective film are hardly generated.

[Semiconductor Package]

The present invention also provides a semiconductor package including the multilayer printed wiring board of the present embodiment having a semiconductor element mounted thereon. The semiconductor package of the present embodiment can be produced by mounting a semiconductor element, such as a semiconductor chip and a memory, at a predetermined position of the printed wiring board of the present invention and sealing the semiconductor element with a sealing resin, etc.

EXAMPLES

The present invention is hereunder described in more detail by reference to Examples, but it should be construed that the present invention is not limited to these Examples.

Photosensitive resin compositions obtained in the respective Examples were evaluated with respect to characteristics by the following methods.

[1. Evaluation of Resolution]

A 1.0 mm-thick copper-cladded laminate substrate (MCL-E-67, manufactured by Hitachi Chemical Company, Ltd.) was prepared; from a carrier film and protective film-provided photosensitive resin film produced in each of the Examples, the protective film was stripped off and removed; and the exposed photosensitive resin film was laminated on the aforementioned copper-cladded laminate substrate using a press type vacuum laminator (a product number: MVLP-500, manufactured by Meiki Co., Ltd.) under a predetermined lamination condition (pressure bonding pressure: 0.4 MPa, press hot plate temperature: 80° C., evacuation time: 25 seconds, lamination press time: 25 seconds, and atmospheric pressure: 4 kPa or less), thereby obtaining a laminate having a photosensitive layer.

Subsequently, using an i-ray exposure apparatus (a product number: UX-22405M-XJ-01, manufactured by Ushio Inc.), exposure was performed in a range of 50 to 1,000 mJ/cm$^2$ at every interval of 50 mJ/cm$^2$ through a negative mask having a via pattern having an aperture diameter of a predetermined size (aperture mask diameter size: 5, 8, 10, 15, 20, 30, 40, 50, 60, 70, 80, 90, and 100 pimp).

Thereafter, the resultant was spray-developed with a 1 mass % sodium carbonate aqueous solution for a time corresponding to two times of a shortest development time (shortest time for which an unexposed area of the photosensitive layer was removed) at 30° C. under a pressure of 1.765×10$^5$ Pa, thereby dissolving the unexposed area through development.

Subsequently, the resultant was exposed with a UV exposure apparatus at an exposure dose of 2,000 mJ/cm$^2$ and then heated at 160° C. for one hour, thereby fabricating a test piece having a cured film provided with a via pattern of a predetermined size on the copper-cladded laminate substrate.

The test piece was observed with a metallurgical microscope. Among mask diameters in which the aperture was confirmed, the smallest mask diameter was defined as a minimum aperture mask diameter and evaluated according to the following criteria.

<Evaluation Criteria>

A: The minimum aperture mask diameter was 15 μm or less.

B: The minimum aperture mask diameter was more than 15 μm and 50 μm or less.

C: The minimum aperture mask diameter was more than 50 μm.

[2. Evaluation of Adhesion to Inner Layer Circuit]

(1) Preparation of Microetching Agent

Respective components were blended in a formulation shown in Table 1, to prepare a microetching agent (aqueous solution). The balance of each blend shown in Table 1 is ion-exchange water.

TABLE 1

| Microetching agent | Blending component | Blending amount (g/L) | pH |
|---|---|---|---|
| Composition 1 | Sodium chloride | 3.0 | 3.1 |
| | Copper(II) oxide | 32.5 | |
| | 76% by mass formic acid aqueous solution | 70.2 | |
| | Sodium formate | 40.0 | |
| Composition 2 | Sodium chloride | 9.0 | 3.1 |
| | Copper(II) oxide | 32.5 | |
| | 76% by mass formic acid aqueous solution | 70.2 | |
| | Sodium formate | 40.0 | |

(2) Fabrication of Measurement Sample

On a plated surface of a test piece in which 20 μm-thick electroplated copper had been formed on an electroplated copper foil having a thickness of 35 μm, the microetching agent (composition 1 or composition 2) shown in Table 1 was sprayed under a condition at 25° C. and a spray pressure of 0.05 MPa, and etching was carried out by controlling an etching time such that an etching amount was 0.1 μm. Subsequently, water washing was performed, and the etching-treated surface was spray-treated with a 3.5% by mass hydrochloric acid aqueous solution at a temperature 25° C. for 10 seconds and then washed with water, followed by drying. On the etching-treated surface of each copper foil after drying, a photosensitive resin film fabricated in each of the Examples, from which the protective film had been stripped off, was laminated, and the laminated was exposed (exposure condition: 2,000 mJ/cm$^2$) and cured (curing condition: 160° C., one hours), thereby forming a composite in which a cured film resulting from curing the photosensitive resin film was provided on the surface thereof. As for the composite, one for measuring a peel strength after performing a moisture absorption degradation test and one for measuring a peel strength without performing a moisture absorption degradation test were prepared.

(3) Moisture Absorption Degradation Test

The above-obtained composite was put into a highly accelerated stress test (HAST) system at 130° C. and a humidity of 85% for 50 hours and subjected to a moisture absorption treatment.

(4) Measurement of Peel Strength

Each of the composite not having been subjected to the moisture absorption treatment and the composite having been subjected to the moisture absorption treatment was measured for the peel strength by the following method.

After a 1.6 mm-thick copper-cladded laminate plate was stuck as a pressure plate onto the cured film which the composite had with an adhesive (a trade name: "BOND E SET", manufactured by Konishi Co., Ltd.), and only the copper foil portion of the test piece was cut in a line shape having a width of 1 cm. Thereafter, the peel strength between the copper foil and the cured film of the test piece having been cut in a line shape was measured in conformity with JIS C6481 and evaluated according to the following criteria.

<Evaluation Criteria>

A: The peel strength was 0.5 kN/m or more.
B: The peel strength was 0.3 kN/m or more and less than 0.5 kN/m.
C: The pee; strength was less than 0.3 kN/m.

Synthesis Example 1; Synthesis of Acid-Modified Epoxy Acrylate Resin A-1

In a reaction vessel, 250 parts by mass of a dicyclopentadiene type epoxy resin (a trade name: "XD-1000", manufactured by Nippon Kayaku Co., Ltd., which is an epoxy resin having a structure represented by the general formula (A-2)) [component (a1)], 70 parts by mass of acrylic acid [component (b)], 0.5 parts by mass of methyl hydroquinone, and 120 parts by mass of carbitol acetate were charged and heated at 90° C. with stirring, to dissolve the mixture. Subsequently, the obtained solution was cooled to 60° C., to which was then added 2 parts by mass of triphenyl phosphine, and the mixture was heated at 100° C. and allowed to react until the acid value of the solution became 1 mgKOH/g. To the solution after the reaction, 98 parts by mass of tetrahydrophthalic anhydride (THPAC) [component (c)] and 850 parts by mass of carbitol acetate were added, and the contents were heated at 80° C. and allowed to react for 6 hours. Thereafter, the resultant was cooled to room temperature, and the solvent was distilled off to obtain THPAC-modified dicyclopentadiene type epoxy acrylate (acid-modified epoxy acrylate resin A-1) having a solid component concentration of 65% by mass as the component (A).

Synthesis Example 2; Synthesis of Acid-Modified Epoxy Acrylate Resin A-2

In a reaction vessel, 90 parts by mass of a dicyclopentadiene type epoxy resin (a trade name: "ADEKA RESIN EP-4088L", manufactured by ADEKA CORPORATION, which is an epoxy resin having a structure represented by the general formula (A-3)) [component (a1)], 70 parts by mass of acrylic acid [component (b)], 0.5 parts by mass of methyl hydroquinone, and 120 parts by mass of carbitol acetate were charged and heated at 90° C. with stirring, to dissolve the mixture. Subsequently, the obtained solution was cooled to 60° C., to which was then added 2 parts by mass of triphenyl phosphine, and the mixture was heated at 100° C. and allowed to react until the acid value of the solution became 1 mgKOH/g. To the solution after the reaction, 98 parts by mass of tetrahydrophthalic anhydride (THPAC) [component (c)] and 850 parts by mass of carbitol acetate were added, and the contents were heated at 80° C. and allowed to react for 6 hours. Thereafter, the resultant was cooled to room temperature, and the solvent was distilled off to obtain THPAC-modified dicyclopentadiene type epoxy acrylate (acid-modified epoxy acrylate resin A-2) having a solid component concentration of 65% by mass as the component (A).

Synthesis Example 3; Synthesis of Acid-Modified Epoxy Acrylate Resin A-3

350 parts by mass of a bisphenol F novolak type epoxy resin (a trade name: "EXA-7376", manufactured by DIC Corporation, which is a bisphenol F novolak type epoxy resin containing a structural unit represented by the general formula (A-5), wherein $Y^{48}$ and $Y^{49}$ are a glycidyl group, and $R^{43}$ and $R^{44}$ are a hydrogen atom) [component (a2)], 70 parts by mass of acrylic acid [component (b)], 0.5 parts by mass of methyl hydroquinone, and 120 parts by mass of carbitol acetate were charged and heated at 90° C. with stirring, to dissolve the mixture. Subsequently, the obtained solution was cooled to 60° C., to which was then added 2 parts by mass of triphenyl phosphine, and the mixture was heated at 100° C. and allowed to react until the acid value of the solution became 1 mgKOH/g. To the solution after the reaction, 98 parts by mass of tetrahydrophthalic anhydride (THPAC) [component (c)] and 850 parts by mass of carbitol acetate were added, and the contents were heated at 80° C. and allowed to react for 6 hours. Thereafter, the resultant was cooled to room temperature to obtain THPAC-modified bisphenol F novolak type epoxy acrylate (acid-modified epoxy acrylate resin A-3) having a solid component concentration of 73% by mass as the component (A).

Examples 1 to 6 and Comparative Examples 1 to 2

(1) Production of Photosensitive Resin Composition

Compositions were blended according to the compounding formulation shown in Table 2 (the unit of each numerical value in the table is a part by mass, and it is a value expressed in terms of a solid component in the case of a solution) and kneaded in a 3-roll mill. Thereafter, methyl ethyl ketone was added such that the solid component concentration became 60% by mass, thereby obtaining a photosensitive resin composition.

(2) Production of Photosensitive Resin Film

Using a 16 μm-thick polyethylene terephthalate film (a trade name: G2-16, manufactured by Teijin Limited) as a carrier film, the photosensitive resin composition prepared in each of the Examples was coated on the carrier film such that a film thickness after drying was 10 μm, and dried using a hot air convention drier at 75° C. for 30 minutes, to form a photosensitive resin film (photosensitive layer). Continuously, on the surface of the photosensitive resin film (photosensitive layer) at the opposite side to the side coming into contact with the carrier film, a polyethylene film (a trade name: NF-15, manufactured by Tamapoly Co., Ltd.) was stuck as a protective film, to fabricate a photosensitive resin film having the carrier film and the protective film stuck thereon.

Using the thus-fabricated photosensitive resin films, the respective evaluations were performed according to the aforementioned methods. The results are shown in Table 2.

TABLE 1

| | | Component | | Unit | Example 1 | Example 2 | Example 3 | Example 4 | Example 5 | Example 6 | Comparative Example 1 | Comparative Example 2 |
|---|---|---|---|---|---|---|---|---|---|---|---|---|
| Photosensitive resin composition | (A) | Acid-modified epoxy acrylate resin A-1; * Corresponding to component (X) | | parts by mass | 27.8 | 27.8 | 27.8 | 13.9 | 13.9 | | | |
| | | Acid-modified epoxy acrylate resin A-2; * Corresponding to component (X) | | parts by mass | | | | 13.9 | | | | |
| | | Acid-modified epoxy acrylate resin A-3 | | parts by mass | | | | | 13.9 | 27.8 | 27.8 | 27.8 |
| | (B) | Photopolymerization initiator 1 | | parts by mass | 0.02 | 0.02 | 0.02 | 0.02 | 0.02 | 0.02 | 0.02 | 0.02 |
| | | Photopolymerization initiator 2 | | parts by mass | 1.1 | 1.1 | 1.1 | 1.1 | 1.1 | 1.1 | 1.1 | 1.1 |
| | | Photopolymerization initiator 3 | | parts by mass | 0.08 | 0.08 | 0.08 | 0.08 | 0.08 | 0.08 | 0.08 | 0.08 |
| | (C) | Dipentaerythritol hexaacrylate | | parts by mass | 5.4 | 5.4 | | 5.4 | 5.4 | | 5.4 | 5.4 |
| | | Tricyclodecanedimethanol diacrylate; * Corresponding to component (X) | | parts by mass | | | 5.4 | | | 5.4 | | |
| | | Tetramethyl biphenol type epoxy resin | | parts by mass | 12.2 | 12.2 | 12.2 | 12.2 | | | 12.2 | 12.2 |
| | (D) | Dicyclopentadiene type epoxy resin; * Corresponding to component (X) | | parts by mass | | | | | 12.2 | 12.2 | | |
| | | Epoxidized polybutadiene | | parts by mass | 2.23 | 2.23 | 2.23 | 2.23 | 2.23 | 2.23 | 2.23 | 2.23 |
| | (E) | Phthalocyanine-based pigment | | parts by mass | 0.24 | 0.24 | 0.24 | 0.24 | 0.24 | 0.24 | 0.24 | 0.24 |
| | (F) | Silica | | parts by mass | 33.9 | | 33.9 | 33.9 | 33.9 | 33.9 | 33.9 | |
| | (G) | Polyester-based elastomer | | parts by mass | 3.2 | 3.2 | 3.2 | 3.2 | 3.2 | 3.2 | 3.2 | 3.2 |
| | (H) | Melamine | | parts by mass | 4.5 | 4.5 | 4.5 | 4.5 | 4.5 | 4.5 | 4.5 | 4.5 |
| | Total mass of dicyclopentadiene structure relative to the total amount of solid components | | | % by mass | 5.4 | 8.7 | 8.1 | 6.1 | 6.9 | 6.8 | 0 | 0 |
| Evaluation resins | Resolution | | | — | B | A | B | B | B | B | B | A |
| | Adhesion to inner layer | Composition 1 | Initial stage | — | A | A | A | A | A | A | A | A |
| | | | After moisture absorption degradation test | — | A | A | A | A | B | B | C | C |
| | | Composition 2 | Initial stage | — | A | A | A | A | B | B | B | B |
| | | | After moisture absorption degradation test | — | B | B | B | B | B | B | C | C |

The respective components used in the respective Examples are as follows.

[Component (A)]
Acid-Modified Epoxy Acrylate Resin A-1:
  THPAC-modified dicyclopentadiene type epoxy acrylate obtained in Synthesis Example 1 (corresponding to the component (X); content of dicyclopentadiene structure: 18% by mass)
Acid-Modified Epoxy Acrylate Resin A-2:
  THPAC-modified dicyclopentadiene type epoxy acrylate obtained in Synthesis Example 2 (corresponding to the component (X); content of dicyclopentadiene structure: 22% by mass)
Acid-Modified Epoxy Acrylate Resin A-3:
  THPAC-modified bisphenol F novolak type epoxy acrylate obtained in Synthesis Example 3
[Component (B)]
Photopolymerization Initiator 1:
Ethanone, 1-[9-ethyl-6-(2-methylbenzoyl)-9H-carbazol-3-yl], 1-(O-acetyloxime)
Photopolymerization Initiator 2:
2-Methyl-1-[4-(methylthio)phenyl]-2-morpholino-1-propanone
Photopolymerization Initiator 3:
2,4-Diethylthioxanthone
[Component (C)]
Dipentaerythritol hexaacrylate
Tricyclodecanedimethanol dimethacrylate (corresponding to component (X); content of dicyclopentadiene structure: 44% by mass)
[Component (D)]
Tetramethyl biphenol type epoxy resin
Dicyclopentadiene type epoxy resin:
  A trade name: "XD-1000", manufactured by Nippon Kayaku Co., Ltd. (corresponding to component (X); content of dicyclopentadiene structure: 31% by mass)
Epoxidized Polybutadiene:
A product name: "PB-4700", manufactured by Daicel Corporation
[Component (E)]
Phthalocyanine-based pigment
[Component (F)]
Silica:
  A trade name: "CRS-2101-41", manufactured by TATSUMORI LTD., average particle diameter: 1.3 µm
[Component (G)]
Polyester-Based Elastomer:
  A trade name: "ESPEL 1108", manufactured by Hitachi Chemical Company, Ltd.
[Component (H)]
Melamine From Table 2, it was confirmed that the cured films formed of the photosensitive resin compositions of Examples 1 to 6 of the present embodiment are excellent with respect to the adhesion to an inner layer after the moisture absorption degradation test such that the peel strength is 0.3 kN/m or more, while providing favorable resolution, so that they are suitable especially as the interlayer insulating layer in the printed wiring board. In contrast, according to the resin compositions of Comparative Examples 1 to 2, the sufficient adhesion to an inner layer was not obtained after the moisture absorption degradation test.

REFERENCE SIGNS LIST

100A: Multilayer printed wiring board
102: Circuit pattern
103: Interlayer insulating layer
104: Via (via hole)
105: Seed layer
106: Resist pattern
107: Circuit layer of copper
108: Solder resist layer

The invention claimed is:

1. A photosensitive resin composition comprising a plurality of components, the components comprising at least:
(A) a photopolymerizable compound having an ethylenically unsaturated group and an acidic substituent,
(B) a photopolymerization initiator,
(D) a thermosetting resin, and
(G) an elastomer, wherein
at least one of the components contained in the photosensitive resin composition is a component including a dicyclopentadiene structure, and
the thermosetting resin (D) comprises a tetramethyl biphenol type epoxy resin.

2. The photosensitive resin composition according to claim 1, wherein the component including a dicyclopentadiene structure is one including a structure represented by the following general formula (X-1):

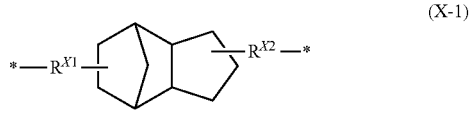

wherein $R^{X1}$ and $R^{X2}$ are each independently a divalent group having at least one group selected from the group consisting of an alkylene group, an arylene group, and an oxy group; and * is a binding site to other structure.

3. The photosensitive resin composition according to claim 1, wherein a total mass of the dicyclopentadiene structure contained in the photosensitive resin composition is 5% by mass or more on the basis of the whole amount of the solid components of the components contained in the photosensitive resin composition.

4. The photosensitive resin composition according to claim 1, wherein the photopolymerizable compound having an ethylenically unsaturated group and an acidic substituent is an acid-modified ethylenically unsaturated group-containing epoxy derivative obtained by allowing (A') a resin that is obtained through a reaction of (a) an epoxy resin and (b) an ethylenically unsaturated group-containing organic acid, to react with (c) a saturated group or unsaturated group-containing polybasic acid anhydride.

5. The photosensitive resin composition according to claim 4, wherein the photopolymerizable compound (A) having an ethylenically unsaturated group and an acidic substituent contains
(A1) an acid-modified ethylenically unsaturated group-containing epoxy derivative that is obtained by using, as the epoxy resin (a), an epoxy resin having a dicyclopentadiene structure, and
(A2) an acid-modified ethylenically unsaturated group-containing epoxy derivative that is obtained by using, as the epoxy resin (a), at least one selected from the group consisting of a novolak type epoxy resin, a bisphenol type epoxy resin, and a triphenolmethane type epoxy resin.

6. The photosensitive resin composition according to claim 1, wherein the photopolymerizable compound (A)

having an ethylenically unsaturated group and an acidic substituent is one including a dicyclopentadiene structure.

7. The photosensitive resin composition according to claim 1, further comprising (C) a photopolymerizable compound not having an acidic substituent.

8. The photosensitive resin composition according to claim 7, wherein the photopolymerizable compound (C) not having an acidic substituent is a polyfunctional monomer having three or more ethylenically unsaturated groups.

9. The photosensitive resin composition according to claim 7, wherein the photopolymerizable compound (C) not having an acidic substituent is one including a dicyclopentadiene structure.

10. The photosensitive resin composition according to claim 1, further comprising (E) a pigment.

11. The photosensitive resin composition according to claim 1, further comprising (F) an inorganic filler.

12. A photosensitive resin composition for photo via formation, comprising the photosensitive resin composition according to claim 1.

13. A photosensitive resin composition for interlayer insulating layer, comprising the photosensitive resin composition according to claim 1.

14. A photosensitive resin film comprising the photosensitive resin composition according to claim 1.

15. A printed wiring board comprising a surface protective film or an interlayer insulating layer that is formed by using the photosensitive resin film according to claim 14.

16. A method for producing a printed wiring board, comprising a step of providing a photosensitive layer using the photosensitive resin film according to claim 14 on a substrate; a step of forming a resin pattern by using the photosensitive layer; and a step of curing the resin pattern to form at least one of a surface protective film and an interlayer insulating layer, in this order.

17. A printed wiring board comprising a surface protective film or an interlayer insulating layer that is formed by using the photosensitive resin composition according to claim 1.

18. A semiconductor package comprising the printed wiring board according to claim 17 having a semiconductor element mounted thereon.

19. A method for producing a printed wiring board, comprising a step of providing a photosensitive layer using the photosensitive resin composition according to claim 1 on a substrate; a step of forming a resin pattern by using the photosensitive layer; and a step of curing the resin pattern to form at least one of a surface protective film and an interlayer insulating layer, in this order.

* * * * *